(12) United States Patent
Yamazaki

(10) Patent No.: US 9,824,888 B2
(45) Date of Patent: Nov. 21, 2017

(54) OXIDE SEMICONDUCTOR FILM AND FORMATION METHOD THEREOF

(71) Applicant: Semiconductor Energy Laboratory Co., Ltd., Atsugi-shi, Kanagawa-ken (JP)

(72) Inventor: Shunpei Yamazaki, Setagaya (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 223 days.

(21) Appl. No.: 14/278,530

(22) Filed: May 15, 2014

(65) Prior Publication Data

US 2014/0346500 A1    Nov. 27, 2014

(30) Foreign Application Priority Data

May 21, 2013 (JP) ................................. 2013-106735

(51) Int. Cl.
  *H01L 29/24* (2006.01)
  *H01L 21/02* (2006.01)
  (Continued)

(52) U.S. Cl.
  CPC ...... *H01L 21/02565* (2013.01); *C23C 14/086* (2013.01); *C23C 14/3457* (2013.01);
  (Continued)

(58) Field of Classification Search
  CPC ... C23C 14/086; C23C 14/3457; C23C 14/35; H01L 21/02554; H01L 21/02565;
  (Continued)

(56) References Cited

U.S. PATENT DOCUMENTS 5,731,856 A   3/1998 Kim et al.
5,744,864 A   4/1998 Cillessen et al.
(Continued)

FOREIGN PATENT DOCUMENTS

CN   102484139 A   5/2012
CN   103339715 A   10/2013
(Continued)

OTHER PUBLICATIONS

Yamazaki.S et al., "Research, Development, and Application of Crystalline Oxide Semiconductor", SID Digest '12 : SID International Symposium Digest of Technical Papers, Jun. 5, 2012, pp. 183-186.

(Continued)

*Primary Examiner* — Thanh T Nguyen
(74) *Attorney, Agent, or Firm* — Robinson Intellectual Property Law Office; Eric J. Robinson

(57) ABSTRACT

To provide a crystalline oxide semiconductor film. By collision of ions with a target including a crystalline In—Ga—Zn oxide, a flat-plate-like In—Ga—Zn oxide is separated. In the flat-plate-like In—Ga—Zn oxide, a first layer including a gallium atom, a zinc atom, and an oxygen atom, a second layer including a zinc atom and an oxygen atom, a third layer including an indium atom and an oxygen atom, and a fourth layer including a gallium atom, a zinc atom, and an oxygen atom are stacked in this order. After the flat-plate-like In—Ga—Zn oxide is deposited over a substrate while maintaining the crystallinity, the second layer is gasified and exhausted.

12 Claims, 20 Drawing Sheets

(51) Int. Cl.
    *C23C 14/34*     (2006.01)
    *C23C 14/35*     (2006.01)
    *C23C 14/08*     (2006.01)
    *H01L 29/786*     (2006.01)

(52) U.S. Cl.
    CPC ........ *C23C 14/35* (2013.01); *H01L 21/02554* (2013.01); *H01L 21/02595* (2013.01); *H01L 21/02631* (2013.01); *H01L 21/02686* (2013.01); *H01L 29/24* (2013.01); *H01L 29/7869* (2013.01)

(58) Field of Classification Search
    CPC ......... H01L 21/02595; H01L 21/02631; H01L 21/02686; H01L 29/24; H01L 29/7869
    See application file for complete search history.

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,202,365 B2 | 6/2012 | Umeda et al. |
| 8,274,078 B2 | 9/2012 | Itagaki et al. |
| 8,319,218 B2 | 11/2012 | Yamazaki et al. |
| 8,492,758 B2 | 7/2013 | Yamazaki et al. |
| 8,669,556 B2 | 3/2014 | Yamazaki et al. |
| 8,680,522 B2 | 3/2014 | Yamazaki et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0163868 A1* | 7/2010 | Yamazaki ........... H01L 27/1225 257/43 |
| 2010/0244029 A1* | 9/2010 | Yamazaki ........... H01L 27/1225 257/52 |
| 2010/0320458 A1 | 12/2010 | Umeda et al. |
| 2010/0320459 A1 | 12/2010 | Umeda et al. |
| 2011/0084264 A1 | 4/2011 | Yamazaki et al. |
| 2011/0101352 A1 | 5/2011 | Hosono et al. |
| 2011/0127521 A1 | 6/2011 | Yamazaki |
| 2011/0201162 A1 | 8/2011 | Hosono et al. |
| 2012/0012838 A1 | 1/2012 | Hosono et al. |
| 2012/0138922 A1 | 6/2012 | Yamazaki et al. |
| 2012/0153364 A1 | 6/2012 | Yamazaki et al. |
| 2012/0261657 A1 | 10/2012 | Takahashi et al. |
| 2012/0267622 A1 | 10/2012 | Yamazaki et al. |
| 2012/0312681 A1* | 12/2012 | Yamazaki ............... C23C 14/08 204/192.1 |
| 2013/0062601 A1 | 3/2013 | Yamazaki et al. |
| 2013/0214273 A1 | 8/2013 | Yamazaki et al. |
| 2013/0341180 A1 | 12/2013 | Yamazaki |
| 2014/0001032 A1 | 1/2014 | Yamazaki |
| 2014/0042018 A1 | 2/2014 | Yamazaki |
| 2014/0183532 A1 | 7/2014 | Yamazaki et al. |
| 2014/0374743 A1 | 12/2014 | Yamazaki |
| 2015/0021593 A1 | 1/2015 | Yamazaki |

FOREIGN PATENT DOCUMENTS

| | | |
|---|---|---|
| CN | 103500712 A | 1/2014 |
| EP | 1737044 A | 12/2006 |
| EP | 2226847 A | 9/2010 |
| EP | 2246894 A | 11/2010 |
| EP | 2413366 A | 2/2012 |
| JP | 60-198861 A | 10/1985 |

(56) References Cited

FOREIGN PATENT DOCUMENTS

| | | |
|---|---|---|
| JP | 63-079791 A | 4/1988 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165528 A | 6/2006 |
| JP | 2010-212696 A | 9/2010 |
| JP | 2010-219538 A | 9/2010 |
| JP | 4620046 | 1/2011 |
| JP | 2011-100979 A | 5/2011 |
| JP | 2012-134475 A | 7/2012 |
| JP | 2013-102171 A | 5/2013 |
| JP | 2013-149994 A | 8/2013 |
| JP | 2013-149995 A | 8/2013 |
| JP | 2014-055349 A | 3/2014 |
| KR | 2012-0090982 A | 8/2012 |
| KR | 2012-0093398 A | 8/2012 |
| KR | 2013-0118921 A | 10/2013 |
| KR | 2013-0124514 A | 11/2013 |
| WO | WO-2004/114391 | 12/2004 |
| WO | WO-2005/088726 | 9/2005 |
| WO | WO-2011/043176 | 4/2011 |
| WO | WO-2012/073844 | 6/2012 |

OTHER PUBLICATIONS

Asakuma.N. et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition: The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physica Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDS", Journal of the SID, 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MoO3 as a Charge-Generation Layer", Adv. Mater. (Adavanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel, YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu, or Zn] at Temperatures Over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

(56) References Cited

OTHER PUBLICATIONS

Kitzerow.H et al., "Observation of Blue Phases in Chiral Networks", Liquid Crystals, 1993, vol. 14, No. 3, pp. 911-916.
Kurokawa.Y et al., "UHF RFCPUS on Flexible and Glass Substrates for Secure RFID Systems", Journal of Solid-State Circuits, 2008, vol. 43, No. 1, pp. 292-299.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Lee.H et al., "Current Status of, Challenges to, and Perspective View of AM-OLED", IDW '06 : Proceedings of the 13th International Display Workshops, Dec. 7, 2006, pp. 663-666.
Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.
Lee.M et al., "15.4:Excellent Performance of Indium-Oxide-Based Thin-Film Transistors by DC Sputtering", SID Digest '09 : SID International Symposuim Digest of Technical Papers, May 31, 2009, pp. 191-193.
Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Miyasaka.M, "SUFTLA Flexible Microelectronics on Their Way to Business", SID Digest '07 : SID International Symposium Digest of Technical Papers, 2007, vol. 38, pp. 1673-1676.
Mo.Y et al., "Amorphous Oxide TFT Backplanes for Large Size AMOLED Displays", IDW '08 : Proceedings of the 6th International Display Workshops, Dec. 3, 2008, pp. 581-584.
Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.
Nakamura.M, "Synthesis of Homologous Compound with New Long-Period Structure", NIRIM Newsletter, Mar. 1, 1995, vol. 150, pp. 1-4.
Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.
Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Nomura.K et al., "Thin-Film Transistor Fabricated in Single-Crystalline Transparent Oxide Semiconductor", Science, May 23, 2003, vol. 300, No. 5623, pp. 1269-1272.
Nowatari.H et al., "60.2: Intermediate Connector With Suppressed Voltage Loss for White TANDEM OLEDs", SID Digest '09 : SID International Symposium Digest of Technical Papers, May 31, 2009, vol. 40, pp. 899-902.
Oba.F et al., "Defect energetics in ZnO: A hybrid Hartree-Fock density functional study", Phys. Rev. B (Physical Review. B), 2008, vol. 77, pp. 245202-1-245202-6.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Ohara.H et al., "21.3:4.0 In. QVGA AMOLED Display Using In—Ga—Zn-Oxide TFTs Wth a Novel Passivation Layer", SID Digest '09 : SID International Symposium Digest of Technical Papers, May 31, 2009, pp. 284-287.
Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Orita.M et al., "Amorphous transparent conductive oxide InGaO3(ZnO)m (m <4):a Zn4s conductor", Philosophical Magazine, 2001, vol. 81, No. 5, pp. 501-515.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Park.J et al., "Amorphous Indium-Gallium-Zinc Oxide TFTs and Their Application for Large Size AMOLED", AM-FPD '08 Digest of Technical Papers, Jul. 2, 2008, pp. 275-278.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.
Park.J et al., "High performance amorphous oxide thin film transistors with self-aligned top-gate structure", IEDM 09: Technical Digest of International Electron Devices Meeting, Dec. 7, 2009, pp. 191-194.
Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.
Park.S et al., "Challenge to Future Displays: Transparent AM-OLED Driven by PEALD Grown ZnO TFT", IMID '07 Digest, 2007, pp. 1249-1252.
Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Prins.M et al., "A Ferroelectric Transparent Thin-Film Transistor", Appl. Phys. Lett. (Applied Physics Letters), Jun. 17, 1996, vol. 68, No. 25, pp. 3650-3652.
Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.
Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.
Takahashi.M et al., "Theoretical Analysis of IGZO Transparent Amorphous Oxide Semicondutor", IDW '08 : Proceedings of the 15th International Display Workshops, Dec. 3, 2008, pp. 1637-1640.
Tsuda.K et al., "Ultra Low Power Consumption Technologies for Mobile TFT-LCDs", IDW '02 : Proceedings of the 9th International Display Workshops, Dec. 4, 2002, pp. 295-298.
Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.
International Search Report (Application No. PCT/JP2014/063139) dated Aug. 19, 2014.

(56) References Cited

OTHER PUBLICATIONS

Written Opinion (Application No. PCT/JP2014/063139) dated Aug. 19, 2014.

* cited by examiner

Cross-sectional structure of the pellet

Upper surface of the pellet

CAAC-OS film
(out-of-plane method)

CAAC-OS film
(in-plane method)

Single crystal OS film
(in-plane method)

Polycrystalline zinc oxide film
(plan-view TEM image)

CAAC-OS film
(plan-view TEM image)

FIG. 5A1
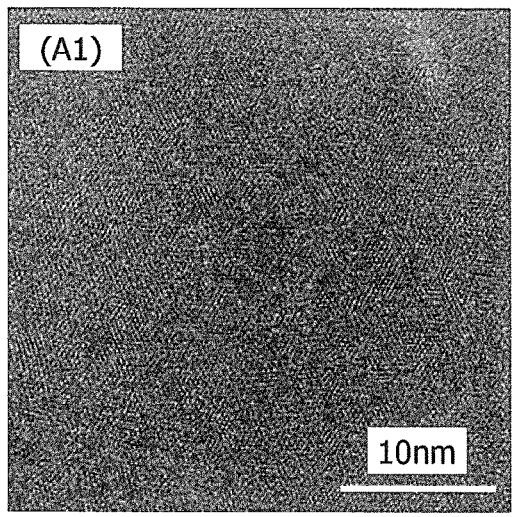
CAAC-OS film
(high-resolution plan-view TEM image)
FIG. 5A2
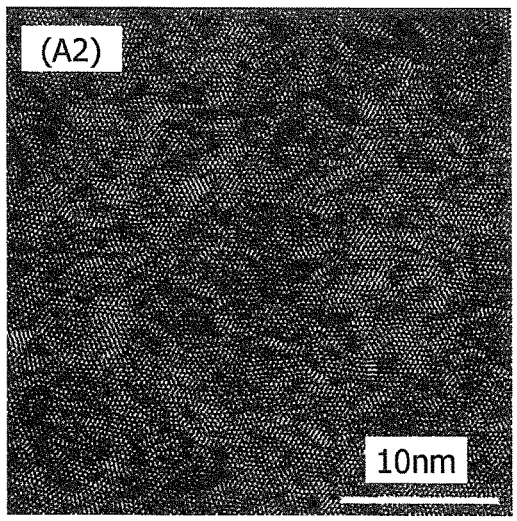
CAAC-OS film
(inverse Fourier transform image)
FIG. 5B1
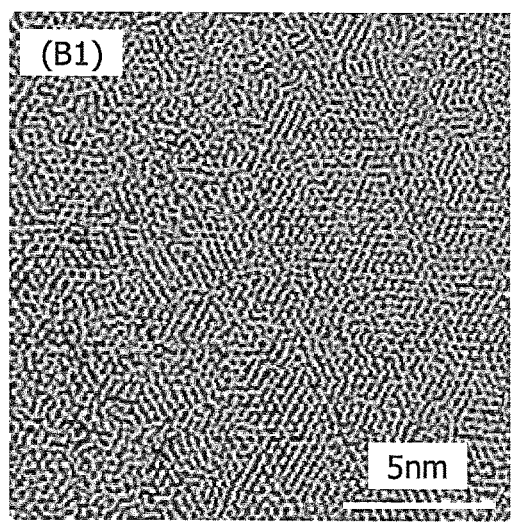
CAAC-OS film
(high-resolution plan-view TEM image)
FIG. 5B2
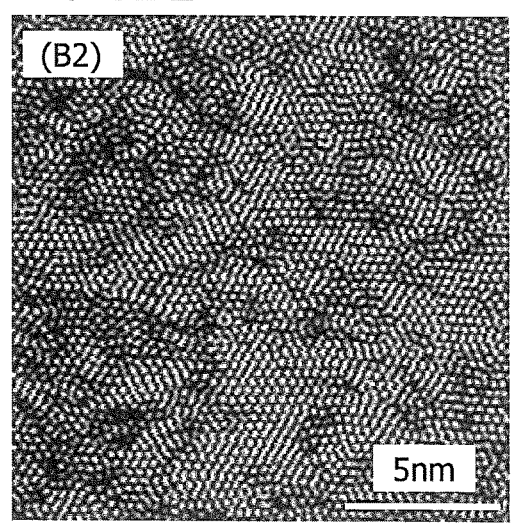
CAAC-OS film
(inverse Fourier transform image)

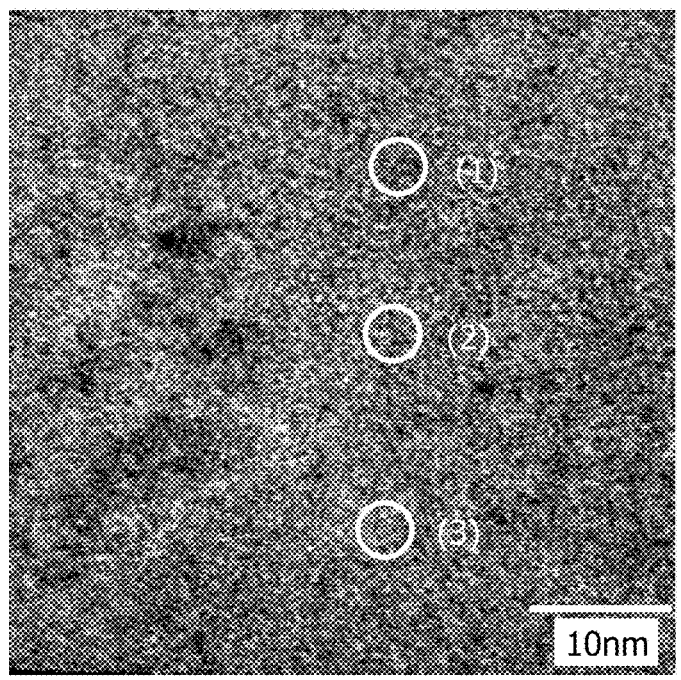
FIG. 6A
CAAC-OS film
(high-resolution plan-view TEM image)
FIG. 6B
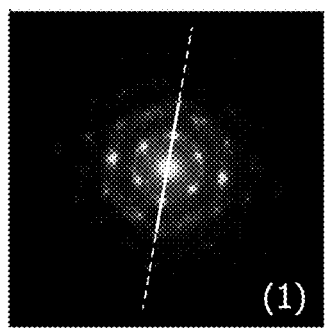
(1)
FIG. 6C
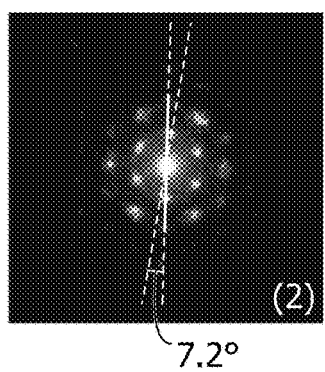
(2)
7.2°
FIG. 6D
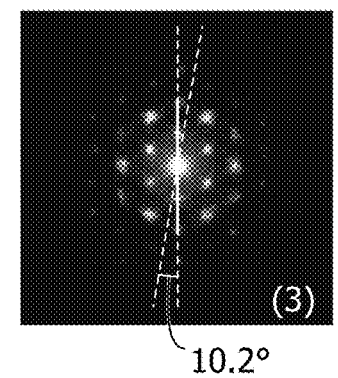
(3)
10.2°
CAAC-OS film
(nanobeam electron diffraction pattern)

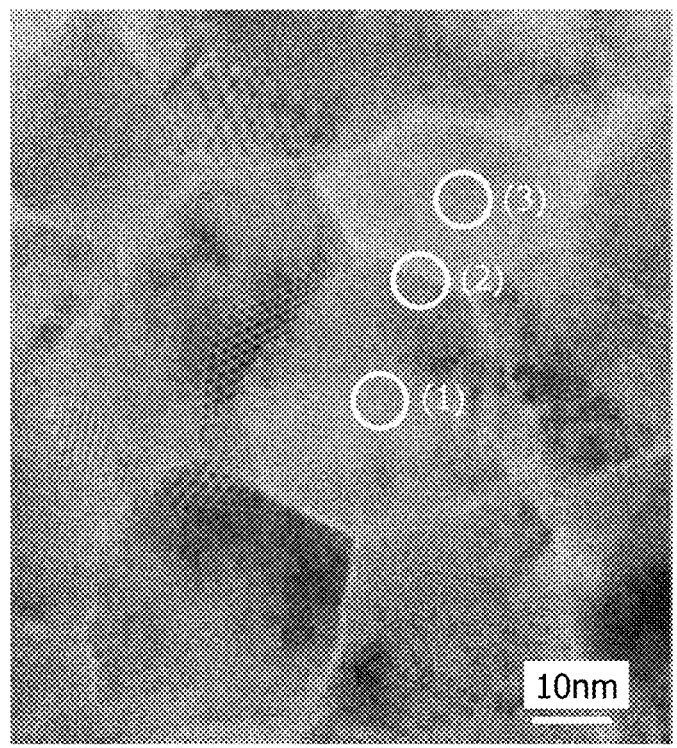
Polycrystalline OS film
(high-resolution plan-view TEM image)
FIG. 7B  FIG. 7C  FIG. 7D
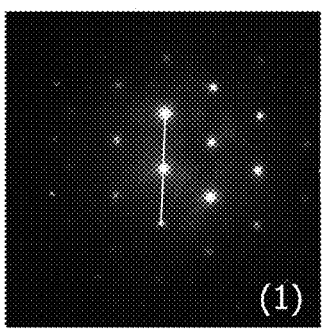 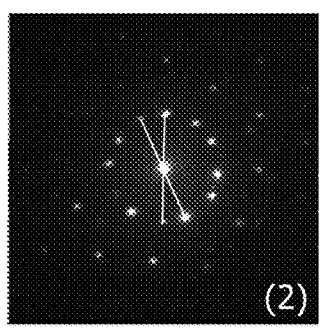 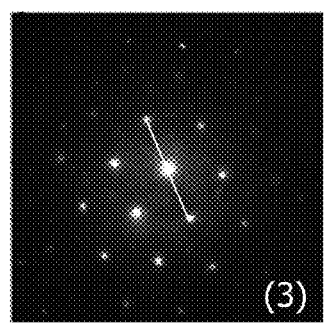
Polycrystalline OS film
(nanobeam electron diffraction pattern)

CAAC-OS film    1 nm

Target    1 nm

InGaZnO₄

FIG. 12A
FIG. 12B
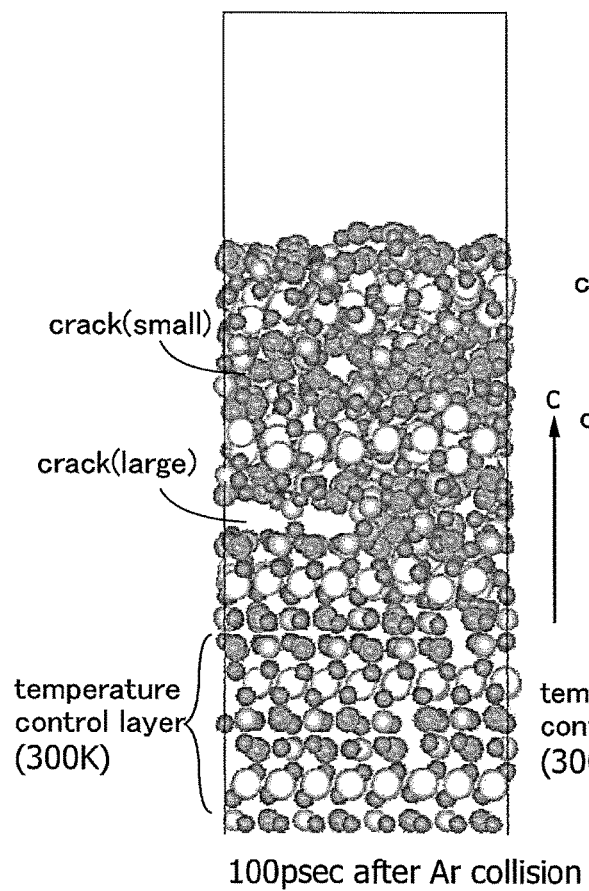
100psec after Ar collision
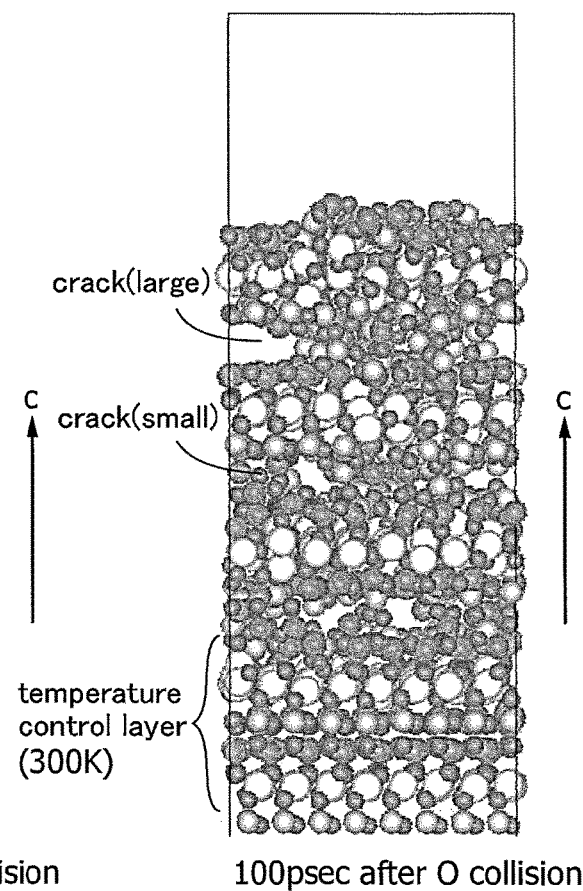
100psec after O collision
In : ○   Ga : ◐   Zn : ●   O : •

0~0.3psec after Ar entrance

0~0.3psec after O entrance silicon oxide film
tungsten film tungsten film
tantalum nitride film silicon oxide film aluminum oxide film Example Sample | Comparison Sample

OXIDE SEMICONDUCTOR FILM AND FORMATION METHOD THEREOF

TECHNICAL FIELD

The present invention relates to an object, a method, or a manufacturing method. In addition, the present invention relates to a process, a machine, manufacture, or a composition of matter. In particular, the present invention relates to, for example, a semiconductor film, a semiconductor device, a display device, a liquid crystal display device, or a light-emitting device. In addition, the present invention relates to a method for manufacturing a semiconductor film, a semiconductor device, a display device, a liquid crystal display device, or a light-emitting device. Alternatively, the present invention relates to a driving method of a semiconductor device, a display device, a liquid crystal display device, or a light-emitting device.

Note that in this specification, a semiconductor device refers to any device that can function by utilizing semiconductor characteristics. An electro-optical device, a display device, a memory device, a semiconductor circuit, an electronic device, and the like are included in or include a semiconductor device in some cases.

BACKGROUND ART

A technique for forming a transistor by using a semiconductor film formed over a substrate having an insulating surface has attracted attention. The transistor is applied to a wide range of semiconductor devices such as an integrated circuit and a display device. A silicon film is known as a semiconductor film applicable to a transistor.

Whether an amorphous silicon film or a polycrystalline silicon film is used as a semiconductor film in a transistor depends on the purpose. For example, in the case of a transistor included in a large display device, an amorphous silicon film, which can be formed using an established technique for forming a film over a large substrate, is preferably used. On the other hand, in the case of a transistor included in a high-performance display device where driver circuits are formed over the same substrate, a polycrystalline silicon film, which can form a transistor having a high field-effect mobility, is preferably used. As a method for forming a polycrystalline silicon film, high-temperature heat treatment or laser light treatment which is performed on an amorphous silicon film has been known.

In recent years, an oxide semiconductor film has attracted attention. For example, a transistor which includes an amorphous In—Ga—Zn oxide film is disclosed (see Patent Document 1). An oxide semiconductor film can be formed by a sputtering method or the like, and thus can be used for a semiconductor film of a transistor in a large display device. A transistor including an oxide semiconductor film has high field-effect mobility; therefore, a high-performance display device where driver circuits are formed over the same substrate can be formed. Moreover, there is an advantage that capital investment can be reduced because part of production equipment for a transistor including an amorphous silicon film can be improved to be used for a transistor including an oxide semiconductor film.

In 1985, synthesis of an In—Ga—Zn oxide crystal was reported (see Non-Patent Document 1). Further, it has been reported that an In—Ga—Zn oxide has a homologous structure and is represented by a composition formula $InGaO_3(ZnO)_m$, (m is a natural number) (see Non-Patent Document 2).

It has been reported that a transistor including a crystalline In—Ga—Zn oxide film has more excellent electrical characteristics and higher reliability than a transistor including an amorphous In—Ga—Zn oxide film (see Non-Patent Document 3). Non-Patent Document 3 reports that a grain boundary is not clearly observed in an In—Ga—Zn oxide film including a c-axis aligned crystal (CAAC).

REFERENCE

Patent Document

[Patent Document 1] Japanese Published Patent Application No. 2006-165528

Non-Patent Document

[Non-Patent Document 1] N. Kimizuka, and T. Mohri, "Spinel, $YbFe_2O_4$, and $Yb_2Fe_3O_7$ Types of Structures for Compounds in the $In_2O_3$ and $Sc_2O_3$-$A_2O_3$—BO Systems [A: Fe, Ga, or Al; B: Mg, Mn, Fe, Ni, Cu, or Zn] at Temperatures over 1000° C.", *J. Solid State Chem.*, Vol. 60, 1985, pp. 382-384

[Non-Patent Document 2] N. Kimizuka, M. Isobe, and M. Nakamura, "Syntheses and Single-Crystal Data of Homologous Compounds, $In_2O_3(ZnO)_m$ (m=3, 4, and 5), $InGaO_3(ZnO)_3$, and $Ga_2O_3(ZnO)_m$ (m=7, 8, 9, and 16) in the $In_2O_3$—$ZnGa_2O_4$—ZnO System", *J. Solid State Chem.*, 1995, Vol. 116, pp. 170-178

[Non-Patent Document 3] S. Yamazaki, J. Koyama, Y. Yamamoto, and K. Okamoto, "Research, Development, and Application of Crystalline Oxide Semiconductor", *SID 2012 DIGEST*, pp. 183-186

DISCLOSURE OF INVENTION

An object of the present invention is to provide a crystalline oxide semiconductor film. Another object of the present invention is to provide a method for forming a crystalline oxide semiconductor film.

Another object of the present invention is to provide a sputtering target which enables the oxide semiconductor film to be deposited.

Another object of the present invention is to provide a method for using the sputtering target.

Another object of the present invention is to provide a transistor which includes the oxide semiconductor film and has stable electrical characteristics.

Another object of the present invention is to provide a highly reliable semiconductor device including the transistor.

Another object of the present invention is to provide a semiconductor device with low off-state current. Another object of the present invention is to provide a semiconductor device with low power consumption. Another object of the present invention is to provide a novel semiconductor device.

Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention is a method for forming an oxide semiconductor film including the steps of: making an ion collide with a target including a crystalline In—Ga—Zn oxide, thereby separating a flat-plate-like In—

Ga—Zn oxide in which a first layer including a gallium atom, a zinc atom, and an oxygen atom, a second layer including a zinc atom and an oxygen atom, a third layer including an indium atom and an oxygen atom, and a fourth layer including a gallium atom, a zinc atom, and an oxygen atom are stacked in this order; and after the flat-plate-like In—Ga—Zn oxide is deposited over a substrate while maintaining the crystallinity, gasifying and exhausting the second layer.

For example, the composition formula of the crystalline In—Ga—Zn oxide included in the target is preferably $InGaZn_2O_5$.

For example, the ion is preferably an oxygen cation.

For example, it is preferable that an oxygen atom at an end portion of the flat-plate-like In—Ga—Zn oxide be negatively charged in plasma.

Another embodiment of the present invention is an oxide semiconductor film over a substrate. The oxide semiconductor film includes a plurality of flat-plate-like crystalline In—Ga—Zn oxides. Flat planes of the plurality of flat-plate-like crystalline In—Ga—Zn oxides face an upper surface of the substrate. In the oxide semiconductor film, a grain boundary is not observed with a transmission electron microscope.

Another embodiment of the present invention is an oxide semiconductor film over a substrate. In the oxide semiconductor film, n layers are stacked (n is a natural number). In the layer, a plurality of flat-plate-like crystalline In—Ga—Zn oxides are arranged. Flat planes of the plurality of flat-plate-like crystalline In—Ga—Zn oxides face an upper surface of the substrate. In the oxide semiconductor film, a grain boundary is not observed with a transmission electron microscope.

For example, an equivalent circle diameter of the flat plane of the flat-plate-like crystalline In—Ga—Zn oxide included in the oxide semiconductor film is preferably greater than or equal to 1 nm and less than or equal to 3 nm.

For example, a thickness of the flat-plate-like crystalline In—Ga—Zn oxide included in the oxide semiconductor film is preferably greater than or equal to 0.5 nm and less than or equal to 0.9 nm.

For example, the oxide semiconductor film preferably includes zinc oxide in a region where the flat-plate-like crystalline In—Ga—Zn oxide is not arranged. For example, the zinc oxide preferably has an amorphous structure.

Another embodiment of the present invention is a transistor including the above-described oxide semiconductor film. Another embodiment of the present invention is a semiconductor device including the transistor.

A crystalline oxide semiconductor film can be provided. A method for forming a crystalline oxide semiconductor film can be provided.

A sputtering target which enables the oxide semiconductor film to be deposited can be provided.

A method for using the sputtering target can be provided.

A transistor which includes an oxide semiconductor film and has stable electrical characteristics can be provided.

A highly reliable semiconductor device including the transistor can be provided.

A semiconductor device with low off-state current can be provided. A semiconductor device with low power consumption can be provided. A novel semiconductor device can be provided.

BRIEF DESCRIPTION OF DRAWINGS

In the accompanying drawings:

FIGS. 5A1, 5A2, 5B1, and 5B2 are high-resolution plan-view TEM images of a CAAC-OS film and show image analysis results thereof;

FIGS. 6A to 6D are a high-resolution plan-view TEM image of a CAAC-OS film and nanobeam electron diffraction patterns of regions thereof;

FIGS. 7A to 7D are a high-resolution plan-view TEM image of a polycrystalline OS film and nanobeam electron diffraction patterns of regions thereof;

FIGS. 11A and 11B show a structure of $InGaZnO_4$ before collision of an atom, and the like;

FIGS. 12A and 12B show a structure of $InGaZnO_4$ after collision of an atom, and the like;

BEST MODE FOR CARRYING OUT THE INVENTION

Figure 1A:
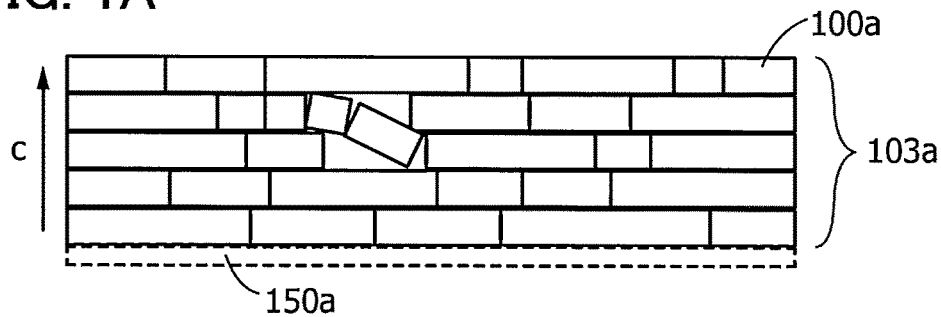
FIGS. 1A to 1D show CAAC-OS films and pellets.

Hereinafter, embodiments of the present invention will be described in detail with reference to the drawings. However, the present invention is not limited to the description below, and it is easily understood by those skilled in the art that modes and details disclosed herein can be modified in various ways. Further, the present invention is not construed as being limited to description of the embodiments. In describing structures of the present invention with reference to the drawings, common reference numerals are used for the same portions in different drawings. Note that the same hatched pattern is applied to similar parts, and the similar parts are not especially denoted by reference numerals in some cases.

Note that the size, the thickness of films (layers), or regions in diagrams is sometimes exaggerated for simplicity.

A voltage usually refers to a potential difference between a given potential and a reference potential (e.g., a source potential or a ground potential (GND)). A voltage can be referred to as a potential and vice versa.

Note that the ordinal numbers such as "first" and "second" in this specification are used for the sake of convenience and do not denote the order of steps or the stacking order of layers. Therefore, for example, description can be made even when "first" is replaced with "second" or "third", as appropriate. In addition, the ordinal numbers in this specification and the like are not necessarily the same as the ordinal numbers used to specify one embodiment of the present invention.

Note that a "semiconductor" includes characteristics of an "insulator" in some cases when the conductivity is sufficiently low, for example. Further, a "semiconductor" and an "insulator" cannot be strictly distinguished from each other in some cases because a border between the "semiconductor" and the "insulator" is not clear. Accordingly, a "semiconductor" in this specification can be called an "insulator" in some cases. Similarly, an "insulator" in this specification can be called a "semiconductor" in some cases.

Further, a "semiconductor" includes characteristics of a "conductor" in some cases when the conductivity is sufficiently high, for example. Further, a "semiconductor" and a "conductor" cannot be strictly distinguished from each other in some cases because a border between the "semiconductor" and the "conductor" is not clear. Accordingly, a "semiconductor" in this specification can be called a "conductor" in some cases. Similarly, a "conductor" in this specification can be called a "semiconductor" in some cases.

Note that an impurity in a semiconductor refers to, for example, elements other than the main components of a semiconductor. For example, an element with a concentration of lower than 0.1 atomic % is an impurity. When an impurity is contained, the density of states (DOS) in a semiconductor may be increased, the carrier mobility may be decreased, or the crystallinity may be decreased. When the semiconductor is an oxide semiconductor, examples of an impurity which changes the characteristics of the semiconductor include Group 1 elements, Group 2 elements, Group 14 elements, Group 15 elements, and transition metals other than the main components; specifically, there are hydrogen (including water), lithium, sodium, silicon, boron, phosphorus, carbon, and nitrogen, for example. When the semiconductor is an oxide semiconductor, oxygen vacancies may be formed by entry of impurities such as hydrogen, for example. Further, when the semiconductor is silicon, examples of an impurity which changes the characteristics of the semiconductor include oxygen, Group 1 elements except hydrogen, Group 2 elements, Group 13 elements, and Group 15 elements.

<Properties of CAAC-OS Film>

A c-axis aligned crystalline oxide semiconductor (CAAC-OS) film, which is a crystalline oxide semiconductor film of this embodiment, will be described below. The CAAC-OS film is an oxide semiconductor film which has c-axis alignment while the directions of a-axes and b-axes are different and in which c-axes are aligned in a direction parallel to a normal vector of a formation surface or a normal vector of a top surface.

Figure 2A:
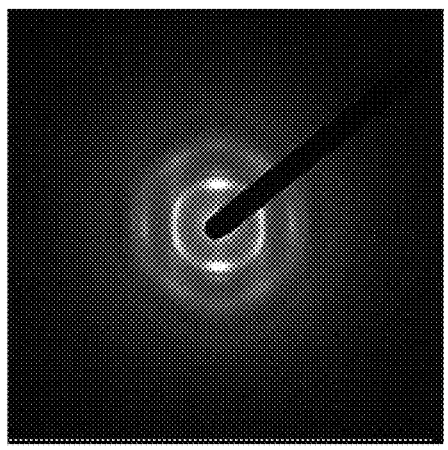
FIGS. 2A and 2B are electron diffraction patterns of a CAAC-OS film.
Figure 2B:
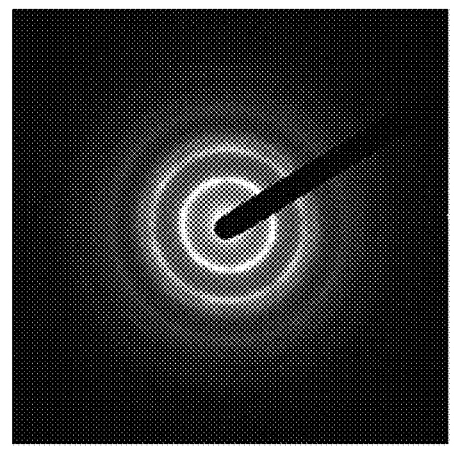

FIG. 2A shows a diffraction pattern (also referred to as a selected-area electron diffraction pattern) when an electron beam having a probe diameter of 300 nm enters an In—Ga—Zn oxide film that is a CAAC-OS film in a direction parallel to a sample surface. As in FIG. 2A, spots due to the (009) plane of an InGaZnO$_4$ crystal are observed. This indicates that crystals in the CAAC-OS film have c-axis alignment and that the c-axes are aligned in a direction substantially perpendicular to the formation surface or the top surface of the CAAC-OS film. Meanwhile, FIG. 2B shows a diffraction pattern when an electron beam having a probe diameter of 300 nm enters the same sample in a direction perpendicular to the sample surface. As in FIG. 2B, a ring-like diffraction pattern is observed.

In this specification, a term "parallel" indicates that the angle formed between two straight lines is greater than or equal to −10° and less than or equal to 10°, and accordingly also includes the case where the angle is greater than or equal to −5° and less than or equal to 5°. In addition, a term "perpendicular" indicates that the angle formed between two straight lines is greater than or equal to 80° and less than or equal to 100°, and accordingly includes the case where the angle is greater than or equal to 85° and less than or equal to 95°.

Figure 3A:
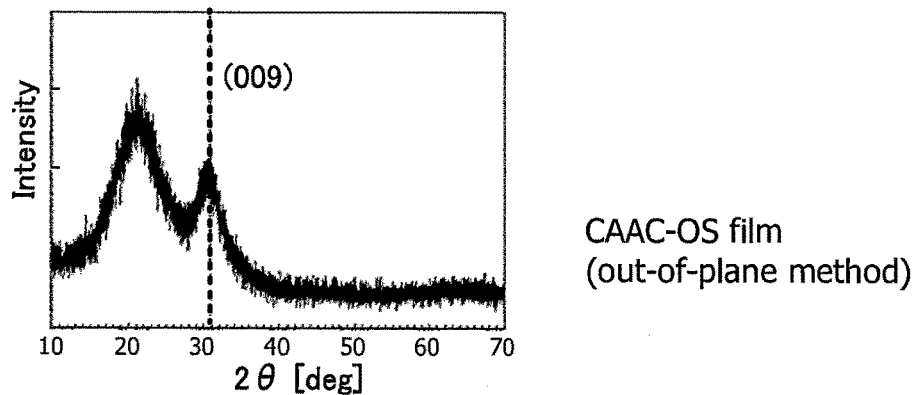
FIGS. 3A to 3C show analysis results of a CAAC-OS film and a single crystal oxide semiconductor film obtained with an X-ray diffractometer.

A CAAC-OS film is subjected to structural analysis with an X-ray diffraction (XRD) apparatus. For example, when the CAAC-OS film including an InGaZnO$_4$ crystal is analyzed by an out-of-plane method, a peak appears when the diffraction angle (2θ) is around 31° (see FIG. 3A). Since this peak is derived from the (009) plane of the InGaZnO$_4$ crystal, it can also be confirmed from the structural analysis with the XRD apparatus that crystals in the CAAC-OS film have c-axis alignment and that the c-axes are aligned in a direction substantially perpendicular to the formation surface or the top surface of the CAAC-OS film.

Figure 3B:
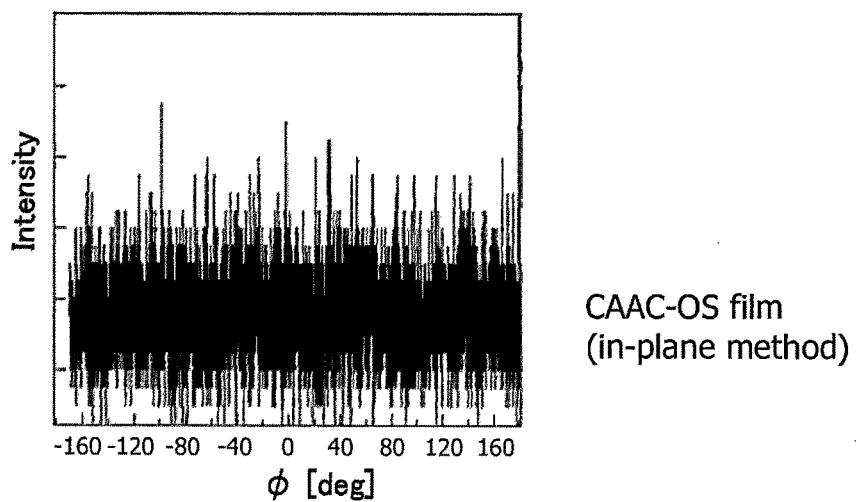
Figure 3C:
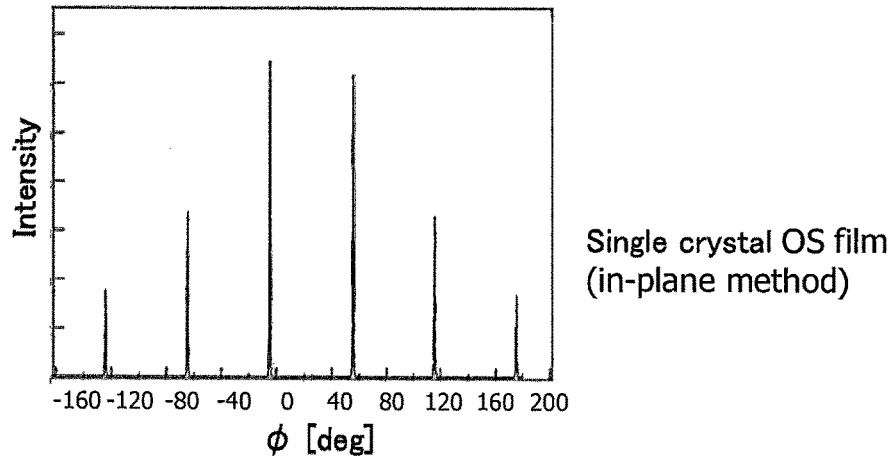

On the other hand, when the CAAC-OS film is analyzed by an in-plane method in which an X-ray enters a sample in a direction substantially perpendicular to the c-axis, a peak appears when 2θ is around 56°. This peak is derived from the (110) plane of the InGaZnO$_4$ crystal. In the case of the CAAC-OS film, when analysis (φ scan) is performed with 2θ fixed at around 56° and with the sample rotated using a normal vector of the sample surface as an axis (φ axis), a peak is not clearly observed (see FIG. 3B). In contrast, in the case of a single crystal oxide semiconductor film of InGaZnO$_4$, when φ scan is performed with 2θ fixed at around 56°, six peaks appear (see FIG. 3C). The six peaks are derived from crystal planes equivalent to the (110) plane. Accordingly, from the structural analysis with the XRD apparatus, it can be confirmed that the directions of a-axes and b-axes are different in the CAAC-OS film.

In a transmission electron microscope (TEM) image of the CAAC-OS film, a boundary between crystal regions, that is, a grain boundary is not clearly observed. Thus, in the CAAC-OS film, a reduction in electron mobility due to the grain boundary is less likely to occur.

Figure 4A:
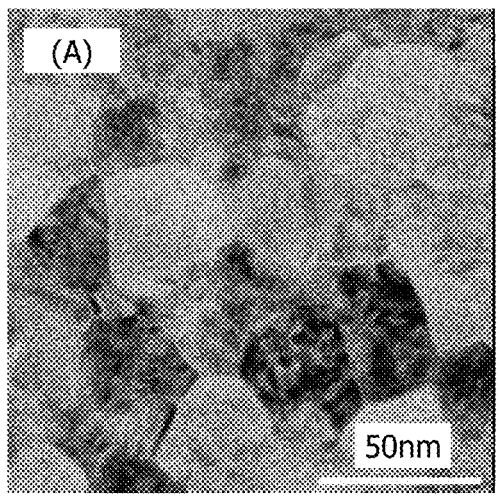
FIGS. 4A and 4B are plan-view TEM images of a zinc oxide film and a CAAC-OS film.
Figure 4B:
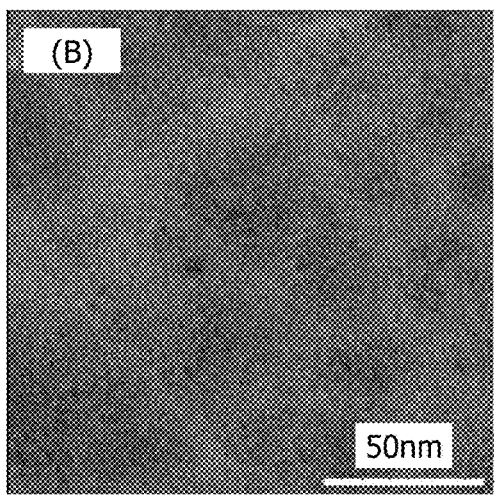

In general, according to the TEM image of a polycrystalline zinc oxide film observed in a direction substantially perpendicular to the sample surface (plan-view TEM image), a clear grain boundary can be seen as shown in FIG. 4A. On the other hand, according to the plan-view TEM image of the same measurement region in the CAAC-OS film, a grain boundary cannot be seen as shown in FIG. 4B.

Further, a combined analysis image of a bright-field image which is obtained by plan-view TEM analysis and a diffraction pattern of the CAAC-OS film (also referred to as a high-resolution plan-view TEM image) was obtained (see FIG. 5A1). Even in the high-resolution plan-view TEM image, a clear grain boundary cannot be seen in the CAAC-OS film.

Here, FIG. 5A2 is an image obtained in such a manner that the high-resolution plan-view TEM image in FIG. 5A1 is transferred by the Fourier transform, filtered, and then transferred by the inverse Fourier transform. By such image processing, a real space image can be obtained in which noises are removed from the high-resolution plan-view TEM image so that only periodic components are extracted. By the image processing, a crystal region can be easily observed, and arrangement of metal atoms in a triangular or hexagonal configuration becomes clear. Note that it is found that there is no regularity of arrangement of metal atoms between different crystal regions.

A further enlarged high-resolution plan-view TEM image of the CAAC-OS film is obtained (see FIG. 5B1). Even in the enlarged high-resolution plan-view TEM image, a clear grain boundary cannot be observed in the CAAC-OS film.

Here, FIG. 5B2 is an image obtained in such a manner that the enlarged high-resolution plan-view TEM image in FIG. 5B1 is transferred by the Fourier transform, filtered, and then transferred by the inverse Fourier transform. The enlarged high-resolution plan-view TEM image is subjected to the image processing; thus, arrangement of metal atoms can be observed more clearly. As in FIG. 5B2, metal atoms are arranged in a regular triangular configuration with interior angles of 60° or a regular hexagonal configuration with interior angles of 120°.

Next, to find how crystal regions are connected in a plane direction in the CAAC-OS film, nanobeam electron diffraction patterns in regions (1), (2), and (3) of a high-resolution plan-view TEM image in FIG. 6A are obtained and shown in FIGS. 6B, 6C, and 6D, respectively. Note that an electron beam with a probe diameter of 1 nm is used to obtain the nanobeam electron diffraction patterns.

From the nanobeam electron diffraction patterns, it is found that the CAAC-OS film has a crystal lattice with six-fold symmetry. Thus, it is also confirmed from the nanobeam electron diffraction patterns in the regions of the high-resolution plan-view TEM image that the CAAC-OS film has c-axis alignment. Further, it is confirmed that the CAAC-OS film has extremely high crystallinity locally.

As in FIGS. 6A to 6D, when attention is focused on the nanobeam electron diffraction patterns in the regions (1), (2), and (3), the angle of the a-axis (indicated by a white solid line) gradually changes in each of the diffraction patterns. Specifically, when the angle of the a-axis in (1) is 0°, the angle of the a-axis in (2) is changed by 7.2° with respect to the c-axis. Similarly, when the angle of the a-axis in (1) is 0°, the angle of the a-axis in (3) is changed by 10.2° with respect to the c-axis. Thus, the CAAC-OS film has a continuous structure in which different crystal regions are connected while maintaining c-axis alignment.

Note that according to a plan-view TEM image of an In—Ga—Zn oxide film crystallized by a laser beam, a clear grain boundary can be seen as shown in FIG. 7A. Thus, the In—Ga—Zn oxide film crystallized by a laser beam is a polycrystalline oxide semiconductor film (polycrystalline OS film).

Next, to find how crystal regions are connected in a plane direction in the polycrystalline OS film, nanobeam electron diffraction patterns in regions (1), (2), and (3) of the plan-view TEM image in FIG. 7A are obtained and shown in FIGS. 7B, 7C, and 7D, respectively. Note that an electron beam with a probe diameter of 1 nm is used to obtain the nanobeam electron diffraction patterns.

As in FIGS. 7A to 7D, when attention is focused on the nanobeam electron diffraction patterns in the regions (1), (2), and (3), the region (2) has a diffraction pattern in which the diffraction patterns in the regions (1) and (3) are overlapped with each other. Accordingly, the grain boundary in the polycrystalline OS film can be confirmed from the electron diffraction patterns.

Figure 8A:
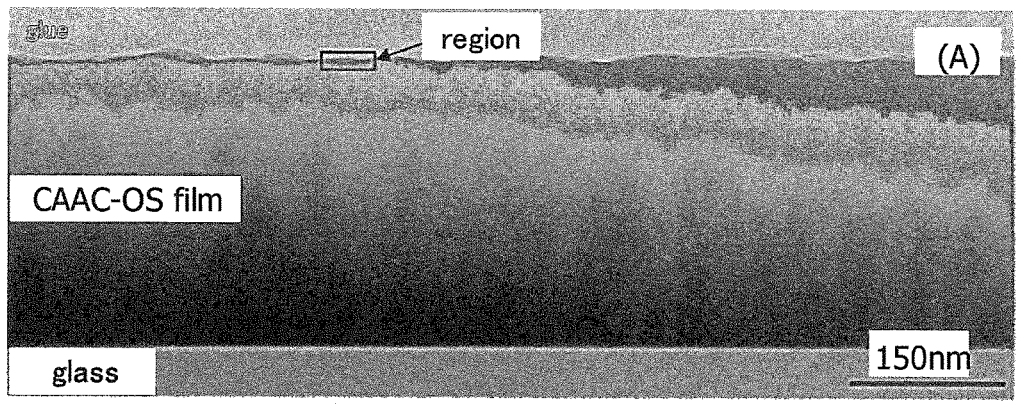
FIGS. 8A to 8C are a cross-sectional TEM image and a high-resolution cross-sectional TEM image of a CAAC-OS film, and shows image analysis results of the high-resolution cross-sectional TEM image.

Next, the CAAC-OS film is observed with a TEM in a direction substantially parallel to the sample surface (a cross-sectional TEM image is obtained) (see FIG. 8A). A combined analysis image of a bright-field image which is obtained by cross-sectional TEM analysis and a diffraction pattern of a region surrounded by a frame (also referred to as a high-resolution cross-sectional TEM image) is obtained in the cross-sectional TEM image shown in FIG. 8A (see FIG. 8B).

Figure 8B:
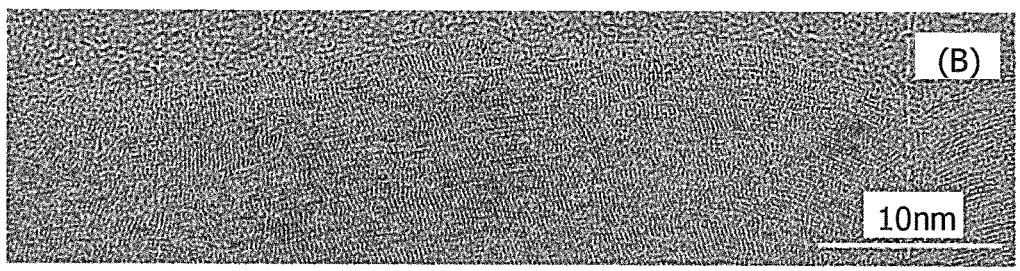
Figure 8C:
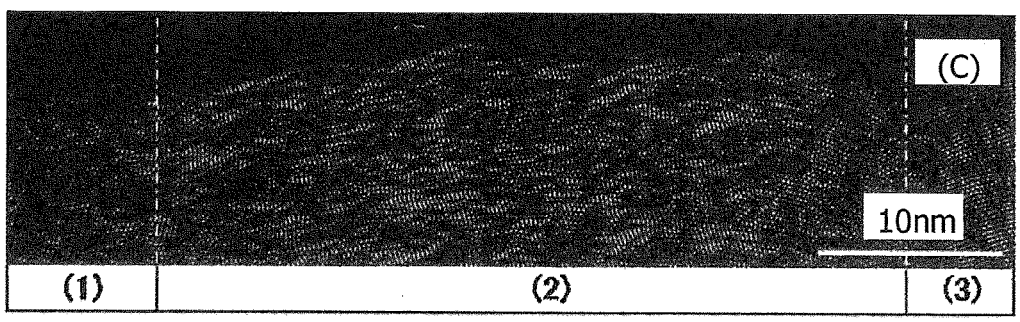

Here, FIG. 8C is an image obtained in such a manner that the high-resolution cross-sectional TEM image in FIG. 8B is transferred by the Fourier transform, filtered, and then transferred by the inverse Fourier transform. By such image processing, a real space image can be obtained in which noises are removed from the high-resolution cross-sectional TEM image so that only periodic components are extracted. By the image processing, a crystal region can be easily observed, and arrangement of metal atoms in a layered manner can be found. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

FIG. 8B can be divided into regions denoted by (1), (2), and (3) from the left. When each of the regions is regarded as one large crystal region, the size of each of the crystal regions is found to be approximately 50 nm. At this time, between (1) and (2) and between (2) and (3), a clear grain boundary cannot be found. In FIG. 8C, crystal regions are connected between (1) and (2) and between (2) and (3).

From the results of the cross-sectional TEM image and the plan-view TEM image, alignment is found in the crystal regions in the CAAC-OS film.

The CAAC-OS film is an oxide semiconductor film having a low impurity concentration. The impurity is an element other than the main components of the oxide semiconductor film, such as hydrogen, carbon, silicon, or a transition metal element. In particular, an element (e.g., silicon) which has higher bonding strength with oxygen than a metal element included in the oxide semiconductor film causes disorder of atomic arrangement in the oxide semiconductor film because the element deprives the oxide semiconductor film of oxygen, thereby reducing crystallinity. Further, a heavy metal such as iron or nickel, argon, carbon dioxide, and the like have a large atomic radius (or molecular radius); therefore, when any of such elements is contained in the oxide semiconductor film, the element causes disorder of the atomic arrangement of the oxide semiconductor film, thereby reducing crystallinity. Note that the impurity contained in the oxide semiconductor film might become a carrier trap or a source of carriers.

The CAAC-OS film is an oxide semiconductor film having a low density of defect states. For example, oxygen vacancies in the oxide semiconductor film serve as carrier traps or serve as carrier generation sources when hydrogen is captured therein.

The state in which impurity concentration is low and density of defect states is low (the number of oxygen vacancies is small) is referred to as "highly purified intrinsic" or "substantially highly purified intrinsic". A highly purified intrinsic or substantially highly purified intrinsic oxide semiconductor film has few carrier generation sources, and thus has a low carrier density. Thus, a transistor including the oxide semiconductor film rarely has a negative threshold voltage (rarely has normally-on characteristics). A highly purified intrinsic or substantially highly purified intrinsic oxide semiconductor film has few carrier traps. Accordingly, the transistor using the oxide semiconductor film has little variation in electrical characteristics and high reliability. Note that charges trapped by the carrier traps in the oxide semiconductor film take a long time to be released and may behave like fixed charges. Thus, the transistor using the oxide semiconductor film with a high impurity concentration and a high density of defect states has unstable electrical characteristics in some cases.

<Model of CAAC-OS Film>

Figure 1B:
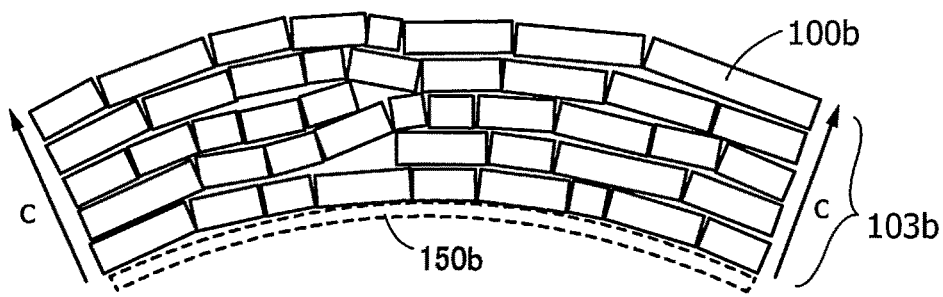

FIGS. 1A and 1B are schematic diagrams of a CAAC-OS film which has the above properties and is provided over a substrate.

FIG. 1A is the cross-sectional schematic diagram of a CAAC-OS film 103a provided over a surface of a substrate 150a which is flat at an atomic size level (atomically flat surface). FIG. 1B is the cross-sectional schematic diagram of a CAAC-OS film 103b provided over a substrate 150b having a convex surface. As illustrated in FIGS. 1A and 1B, in the CAAC-OS film 103a and the CAAC-OS film 103b, a plurality of flat-plate-like particles denoted by pellets 100a and pellets 100b are arranged to face upper surfaces of the substrate 150a and the substrate 150b. The side surfaces of the pellets 100a are connected and the side surfaces of the pellets 100b are connected; thus, it seems as if the pellets 100a form one large crystal region and the pellets 100b form one large crystal region in some cases. Note that the pellets 100a and the pellets 100b cannot be distinguished from each other. Therefore, the pellets 100a and the pellets 100b are collectively referred to as pellets in some cases for convenience.

Figure 1C:
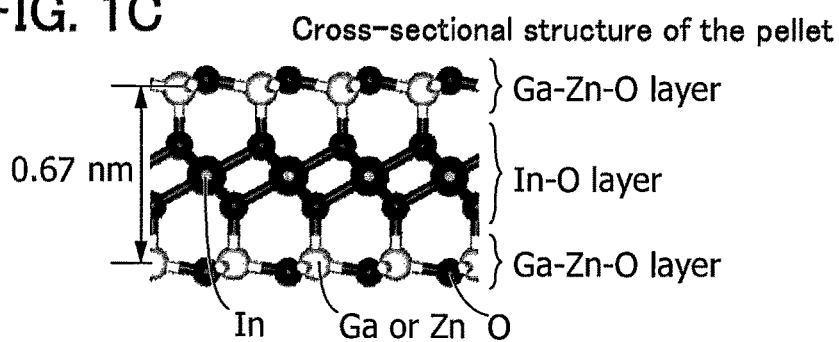

FIG. 1C shows a cross-sectional structure of the pellet. The pellet is a single crystal or a crystal including a damaged region which includes a first layer (also referred to as a Ga—Zn—O layer) formed of gallium (Ga), zinc (Zn), and oxygen (O), a second layer (also referred to as an In—O layer) which is over the first layer and formed of indium (In) and oxygen (O), and a third layer (also referred to as a Ga—Zn—O layer) which is over the second layer and formed of gallium (Ga), zinc (Zn), and oxygen (O). The atomic ratio of Ga to Zn and O of each of the first layer and the third layer is approximately 1:1:2. Further, the atomic ratio of In to O of the second layer is approximately 1:2. Note that the height (longitudinal length) of the cross section of the pellet is greater than or equal to 0.5 nm and less than or equal to 0.9 nm in many cases, and is approximately 0.67 nm in the structure shown in FIG. 1C. The width (lateral length) of the cross section of the pellet is greater than or equal to 1 nm and less than or equal to 3 nm in many cases. Accordingly, a crystal region in which 3 to 20 pellets are connected has a size of greater than or equal to 3 nm and less than or equal to 60 nm. One crystal region has a size of greater than or equal to 3 nm and less than or equal to 20 nm in many cases. Note that in this specification, a size of an object having a complicated shape may be represented as an equivalent circular diameter of a cross section of the object. The term "equivalent circle diameter of a cross section of the object" refers to the diameter of a perfect circle having the same area as that of the cross section of the object.

Figure 1D:
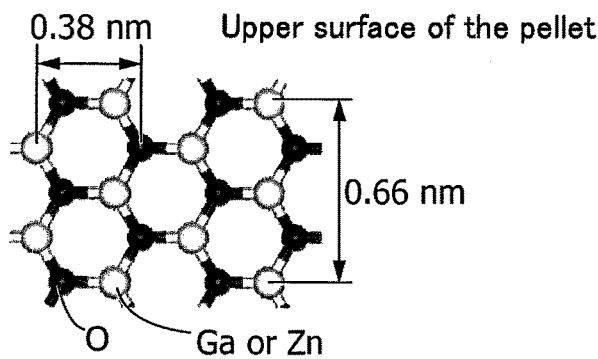

FIG. 1D shows a structure of an upper surface of the pellet. The uppermost layer of the pellet is a Ga—Zn—O layer. In an atomic arrangement of gallium or zinc in the upper surface of the pellet, an atomic arrangement in which triangles (regular triangles) are repeated can be seen and an atomic arrangement in which six triangles form a hexagon (regular hexagon) also can be seen. Thus, the shape of the flat plane of the pellet is a triangle (regular triangle) in many cases. In some cases, a shape formed of two to six triangles is obtained. For example, two triangles (regular triangles) form a quadrangle (diamond shape), and six triangles (regular triangles) form a hexagon (regular hexagon).

By arranging flat planes of the pellets shown in FIGS. 1C and 1D so that they face the upper surface of the substrate 150a or the substrate 150b, the CAAC-OS film 103a and the CAAC-OS film 103b as illustrated in FIG. 1A and FIG. 1B are formed. Thus, the c-axes of crystals included in the CAAC-OS film 103a and the CAAC-OS film 103b are aligned in a direction parallel to normal vectors of the upper surfaces of the substrate 150a and the substrate 150b.

As illustrated in FIG. 1A, the CAAC-OS film 103a provided over the flat surface of the substrate 150a has a structure in which five layers, in each of which the pellets 100a are arranged, are stacked. Since the substrate 150a has the flat surface, a gap is less likely to be formed among the pellets 100a in the CAAC-OS film 103a. Although FIG. 1A illustrates the CAAC-OS film 103a having the structure in which the five layers, in each of which the pellets 100a are arranged, are stacked, the structure of the CAAC-OS film 103a is not limited thereto. For example, the CAAC-OS film 103a may have a structure in which n layers (n is a natural number), in each of which the pellets 100a are arranged, are stacked.

As illustrated in FIG. 1B, the CAAC-OS film 103b provided over the convex surface of the substrate 150b has a structure in which five layers, in each of which the pellets 100b are arranged along the convex surface, are stacked. Since the substrate 150b has the convex surface, as compared to FIG. 1A, a gap is easily formed among the pellets 100b in the CAAC-OS film 103b in some cases. Note that owing to intermolecular force, the pellets 100b are arranged so that a gap among the pellets 100b is as small as possible even over the convex surface. Therefore, even in the case of the convex surface, an oxide semiconductor film having high crystallinity can be formed. The same applies to the case of an uneven surface, the case of a concave surface, and the like. Although FIG. 1B illustrates the CAAC-OS film 103b having the structure in which the five layers, in each of which the pellets 100b are arranged, are stacked, the structure of the CAAC-OS film 103b is not limited thereto. For example, the CAAC-OS film 103b may have a structure in which n layers (n is a natural number), in each of which the pellets 100b are arranged, are stacked.

There is a possibility that a gap among the pellets is filled with zinc oxide. The zinc oxide may be amorphous zinc oxide or crystalline zinc oxide.

As described above, the CAAC-OS film has substantially the same density as a single crystal OS film. For example, the density of the single crystal OS film having a homologous structure of $InGaZnO_4$ is 6.36 $g/cm^3$, and the density of the CAAC-OS film having substantially the same atomic ratio is approximately 6.3 $g/cm^3$.

Figure 9A:
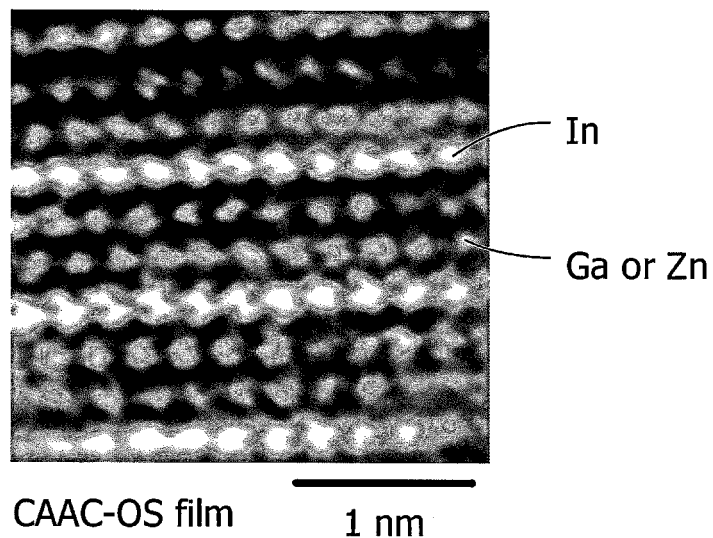
FIGS. 9A and 9B are cross-sectional HAADF-STEM images of a CAAC-OS film and a target.
Figure 9B:
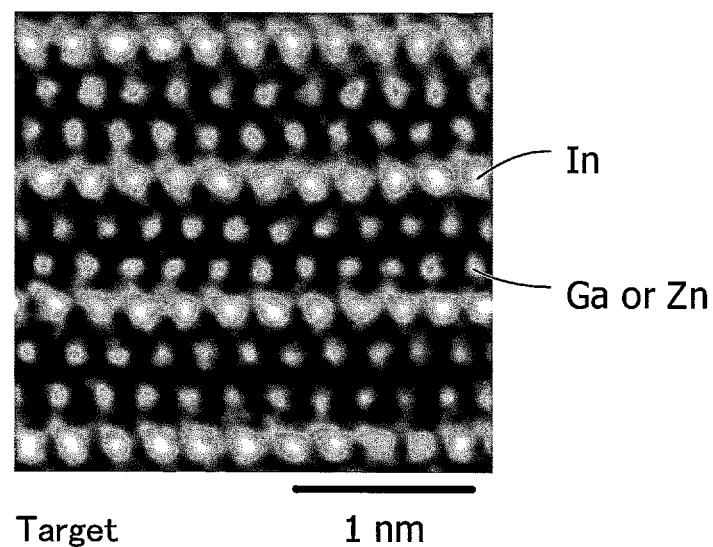

FIGS. 9A and 9B show atomic arrangements of cross sections of an In—Ga—Zn oxide film (see FIG. 9A) that is a CAAC-OS film deposited by a sputtering method and a target thereof (see FIG. 9B). For observation of atomic arrangement, a high-angle annular dark field scanning transmission electron microscopy (HAADF-STEM) was used. The contrast of the image of each of the atoms in a HAADF-STEM image is proportional to the square of its atomic number. Therefore, Zn (atomic number: 30) and Ga (atomic number: 31), which have close atomic numbers, are difficult to distinguish. A Hitachi scanning transmission electron microscope HD-2700 was used for the HAADF-STEM.

When FIG. 9A and FIG. 9B are compared, it is found that the CAAC-OS film and the target each have a homologous structure and arrangements of atoms in the CAAC-OS film correspond to those in the target.

<Method for Forming CAAC-OS Film>

Reasons for forming such a complicated structure as if the structure is copied from a target can be explained using a deposition model described later.

Figure 10A:
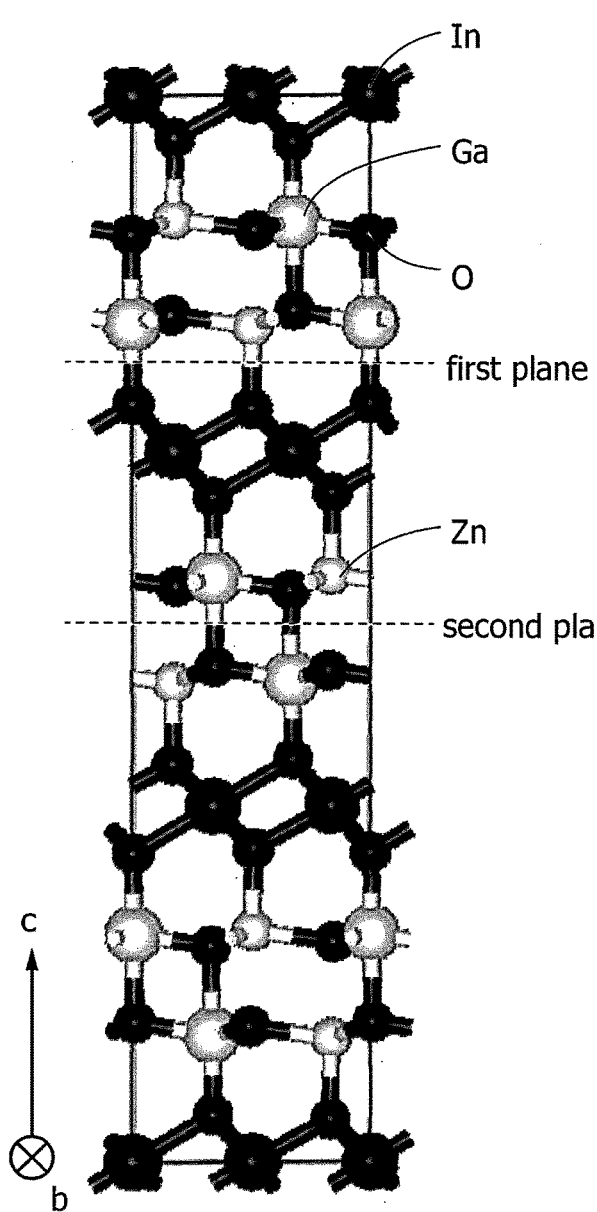
FIGS. 10A and 10B show an $InGaZnO_4$ crystal.
Figure 10B:
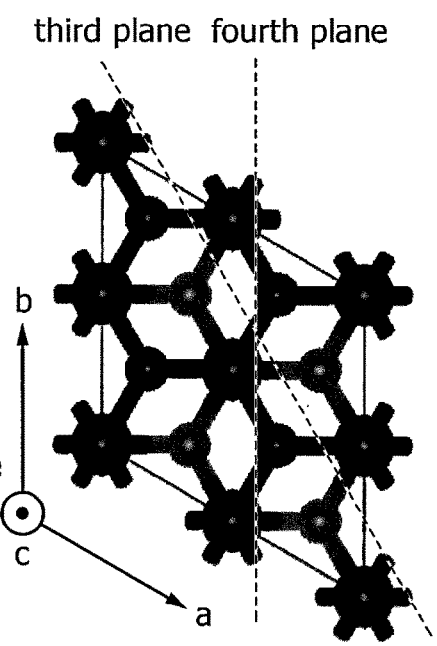

Before the description of the model, a cleavage plane of the target is described with reference to FIGS. 10A and 10B. FIGS. 10A and 10B show a structure of an InGaZnO$_4$ crystal. Note that FIG. 10A shows a structure of the case where the InGaZnO$_4$ crystal is observed from a direction parallel to the b-axis when the c-axis is in an upward direction. Further, FIG. 10B shows a structure of the case where the InGaZnO$_4$ crystal is observed from a direction parallel to the c-axis.

Energy needed for cleavage at each of crystal planes of the InGaZnO$_4$ crystal was calculated by the first principles calculation. Note that a pseudopotential and density functional theory program (CASTEP) using the plane wave basis were used for the calculation. Note that an ultrasoft type pseudopotential was used as the pseudopotential. GGA/PBE was used as the functional. Cut-off energy was 400 eV.

Energy of a structure in an initial state was obtained after structural optimization including a cell size was performed. Further, energy of a structure after the cleavage at each plane was obtained after structural optimization of atomic arrangement was performed in a state where the cell size was fixed.

On the basis of the structure of the InGaZnO$_4$ crystal shown in FIGS. 10A and 10B, a structure cleaved at any one of the first plane, the second plane, the third plane, and the fourth plane was formed and subjected to structural optimization calculation in which the cell size was fixed. Here, the first plane is a crystal plane between a Ga—Zn—O layer and an In—O layer and is parallel to the (001) plane (or the a-b plane) (see FIG. 10A). The second plane is a crystal plane between a Ga—Zn—O layer and a Ga—Zn—O layer and is parallel to the (001) plane (or the a-b plane) (see FIG. 10A). The third plane is a crystal plane parallel to the (110) plane (see FIG. 10B). The fourth plane is a crystal plane parallel to the (100) plane (or the b-c plane) (see FIG. 10B).

Under the above conditions, the energy of the structure after the cleavage at each plane was calculated. Next, a difference between the energy of the structure after the cleavage and the energy of the structure in the initial state was divided by the area of the cleavage plane; thus, cleavage energy which served as a measure of easiness of cleavage at each plane was calculated. Note that the energy of a structure is calculated based on atoms and electrons included in the structure. That is, kinetic energy of the electrons and interactions between the atoms, between the atom and the electron, and between the electrons are considered in the calculation.

As calculation results, the cleavage energy of the first plane was 2.60 J/m$^2$, that of the second plane was 0.68 J/m$^2$, that of the third plane was 2.18 J/m$^2$, and that of the fourth plane was 2.12 J/m$^2$ (see Table 1).

TABLE 1

| | Cleavage Energy [J/m$^2$] |
| --- | --- |
| First Plane | 2.60 |
| Second Plane | 0.68 |
| Third Plane | 2.18 |
| Fourth Plane | 2.12 |

From the calculations, in the structure of the InGaZnO$_4$ crystal shown in FIGS. 10A and 10B, the cleavage energy at the second plane is the lowest. In other words, a plane between a Ga—Zn—O layer and a Ga—Zn—O layer is cleaved most easily (cleavage plane). Therefore, in this specification, the cleavage plane indicates the second plane, which is a plane where cleavage is performed most easily.

Since the cleavage plane is the second plane between a Ga—Zn—O layer and a Ga—Zn—O layer, the InGaZnO$_4$ crystals shown in FIG. 10A can be separated at two planes equivalent to the second planes. Thus, the minimum unit of the InGaZnO$_4$ crystal is considered to include three layers, i.e., a Ga—Zn—O layer, an In—O layer, and a Ga—Zn—O layer. Therefore, there is a high possibility that the cross section of the pellet has the structure shown in FIG. 1C. Separation occurs at two cleavage planes to obtain the pellet. Therefore, the pellet can also be called a cleavage unit.

<Deposition Model of CAAC-OS Film>

The CAAC-OS film can be deposited using a cleavage plane in a crystal. A deposition model of the CAAC-OS film using a sputtering method is described below.

Figure 11A:
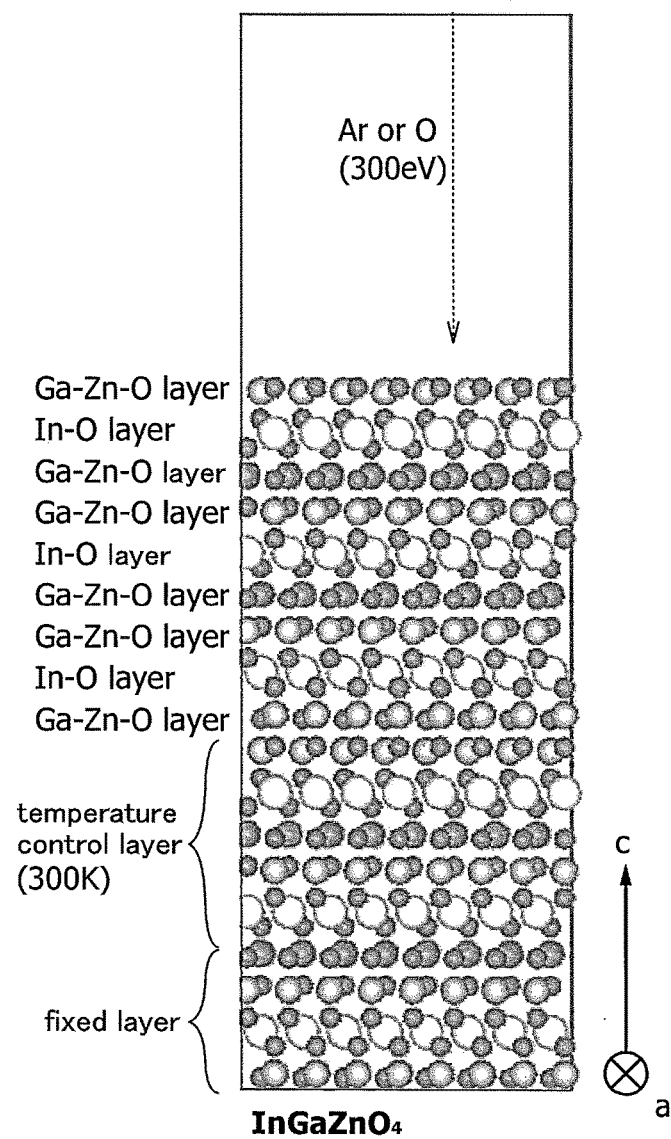
Figure 11B:
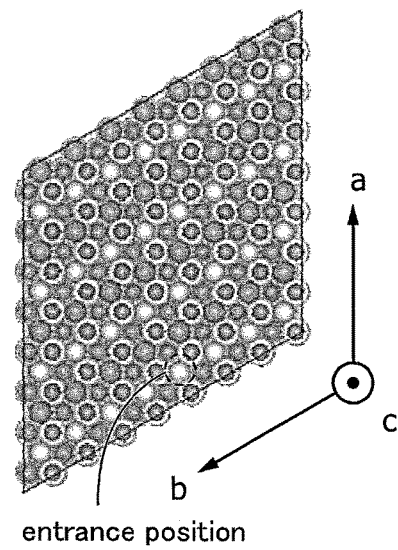

Here, through classical molecular dynamics calculation, on the assumption of an InGaZnO$_4$ crystal having a homologous structure as a target, a cleavage plane in the case where the target is sputtered using argon (Ar) or oxygen (O) was evaluated. FIG. 11A shows a cross-sectional structure of an InGaZnO$_4$ crystal (2688 atoms) used for the calculation, and FIG. 11B shows a top structure thereof. Note that a fixed layer in FIG. 11A is a layer which prevents the positions of the atoms from moving. A temperature control layer in FIG. 11A is a layer whose temperature is constantly set to a fixed temperature (300 K).

For the classical molecular dynamics calculation, Materials Explorer 5.0 manufactured by Fujitsu Limited. was used. Note that the initial temperature, the cell size, the time step size, and the number of steps were set to be 300 K, a certain size, 0.01 fs, and ten million, respectively. In calculation, an atom to which an energy of 300 eV was applied was made to enter a cell from a direction perpendicular to the a-b plane of the InGaZn$_4$O crystal under the conditions.

FIG. 12A shows an atomic arrangement when 99.9 picoseconds have passed after argon enters the cell including the InGaZnO$_4$ crystal shown in FIGS. 11A and 11B. FIG. 12B shows an atomic arrangement when 99.9 picoseconds have passed after oxygen enters the cell. Note that in FIGS. 12A and 12B, part of the fixed layer in FIG. 11A is omitted.

According to FIG. 12A, in a period from entry of argon into the cell to when 99.9 picoseconds have passed, a crack was formed from the cleavage plane corresponding to the second plane shown in FIG. 10A. Thus, in the case where argon collides with the InGaZnO$_4$ crystal and the uppermost surface is the second plane (the zero-th), a large crack was found to be formed in the second plane (the second).

On the other hand, according to FIG. 12B, in a period from entry of oxygen into the cell to when 99.9 picoseconds have passed, a crack was found to be formed from the cleavage plane corresponding to the second plane shown in FIG. 10A. Note that in the case where oxygen collides with the cell, a large crack was found to be formed in the second plane (the first) of the InGaZnO$_4$ crystal.

Accordingly, it is found that an atom (ion) collides with a target including an InGaZnO$_4$ crystal having a homologous structure from the upper surface of the target, the InGaZnO$_4$ crystal is cleaved along the second plane, and a pellet is separated. It is also found that the pellet formed in the case where oxygen collides with the cell is smaller than that formed in the case where argon collides with the cell.

The above calculation suggests that the separated pellet includes a damaged region. In some cases, the damaged region included in the pellet can be repaired in such a manner that a defect caused by the damage reacts with oxygen. Repairing the damaged portion included in the pellet is described later.

Here, difference in size of the pellet depending on atoms which are made to collide was studied.

Figure 13A:
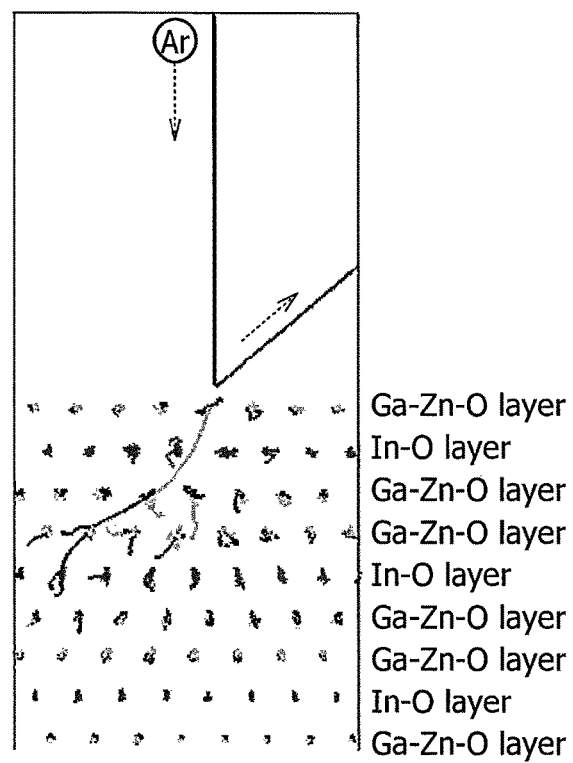
FIGS. 13A and 13B show trajectories of atoms after collision of atoms.

FIG. 13A shows trajectories of the atoms from 0 picosecond to 0.3 picoseconds after argon enters the cell including the InGaZnO$_4$ crystal shown in FIGS. 11A and 11B. Accordingly, FIG. 13A corresponds to a period from FIGS. 11A and 11B to FIG. 12A.

From FIG. 13A, when argon collides with gallium (Ga) of the first layer (Ga—Zn—O layer) counted from the top, the gallium collides with zinc (Zn) of the third layer (Ga—Zn—O layer) counted from the top and then, the zinc reaches the vicinity of the sixth layer (Ga—Zn—O layer) counted from the top. Note that the argon which collides with the gallium is sputtered to the outside. Accordingly, in the case where argon collides with the target including the InGaZnO$_4$ crystal, a crack is thought to be formed in the second plane (the second) in FIG. 11A.

Figure 13B:
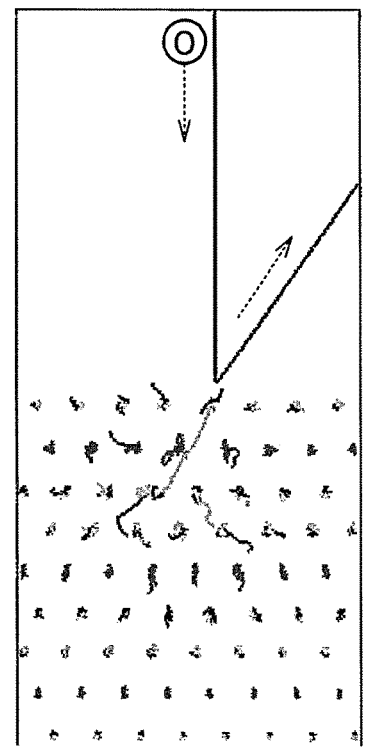

FIG. 13B shows trajectories of the atoms from 0 picosecond to 0.3 picoseconds after oxygen enters the cell including the InGaZnO$_4$ crystal shown in FIGS. 11A and 11B. Accordingly, FIG. 13B corresponds to a period from FIGS. 11A and 11B to FIG. 12A.

On the other hand, from FIG. 13B, when oxygen collides with gallium (Ga) of the first layer (Ga—Zn—O layer), the gallium collides with zinc (Zn) of the third layer (Ga—Zn—O layer) counted from the top and then, the zinc does not reach the fifth layer (In—O layer) counted from the top. Note that the oxygen which collides with the gallium is sputtered to the outside. Accordingly, in the case where oxygen collides with the target including the InGaZnO$_4$ crystal, a crack is thought to be formed in the second plane (the first) in FIG. 11A.

This calculation also shows that the InGaZnO$_4$ crystal with which an atom (ion) collides is separated from the cleavage plane.

In addition, difference in depth of a crack is examined in view of conservation laws. The energy conservation law and the law of conservation of momentum can be represented by the following formula (1) and the following formula (2). Here, E represents energy of argon or oxygen before collision (300 eV), $m_A$ represents mass of argon or oxygen, $v_A$ represents the speed of argon or oxygen before collision, $v'_A$ represents the speed of argon or oxygen after collision, $m_{Ga}$ represents mass of gallium, $v_{Ga}$ represents the speed of gallium before collision, and $v'_{Ga}$ represents the speed of gallium after collision.

[Formula 1]

$$E = \frac{1}{2}m_A v_A^2 + \frac{1}{2}m_{Ga} v_{Ga}^2 \quad (1)$$

[Formula 2]

$$m_A v_A + m_{Ga} v_{Ga} = m_A v'_A + m_{Ga} v'_{Ga} \quad (2)$$

On the assumption that collision of argon or oxygen is elastic collision, the relationship among $v_A$, $v'_A$, $v_{Ga}$, and $v'_{Ga}$ can be represented by the following formula (3).

[Formula 3]

$$v'_A - v'_{Ga} = -(v_A - v_{Ga}) \quad (3)$$

From the formulae (1), (2), (3), and $v_{Ga}=0$, the speed of gallium $v'_{Ga}$ after collision of argon or oxygen can be represented by the following formula (4).

[Formula 4]

$$v'_{Ga} = \frac{\sqrt{m_A}}{m_A + m_{Ga}} \cdot 2\sqrt{2E} \quad (4)$$

In the formula (4), mass of argon or oxygen is substituted into $m_A$, whereby the speeds after collision of the atoms are compared. In the case where the argon and the oxygen have the same energy before collision, the speed of gallium in the case where argon collides with the gallium was found to be 1.24 times as high as that in the case where oxygen collides with the gallium. Thus, the energy of the gallium in the case where argon collides with the gallium is higher than that in the case where oxygen collides with the gallium by the square of the speed.

The speed (energy) of gallium after collision in the case where argon collides with the gallium was found to be higher than that in the case where oxygen collides with the gallium. Accordingly, it is considered that a crack is formed at a deeper position in the case where argon collides with the gallium than in the case where oxygen collides with the gallium.

The above calculation shows that when a target including the InGaZnO$_4$ crystal having a homologous structure is sputtered, separation occurs from the cleavage plane to form a pellet. Next, a model in which sputtered pellets are deposited to form the CAAC-OS film is described with reference to FIG. 14.

Figure 14:
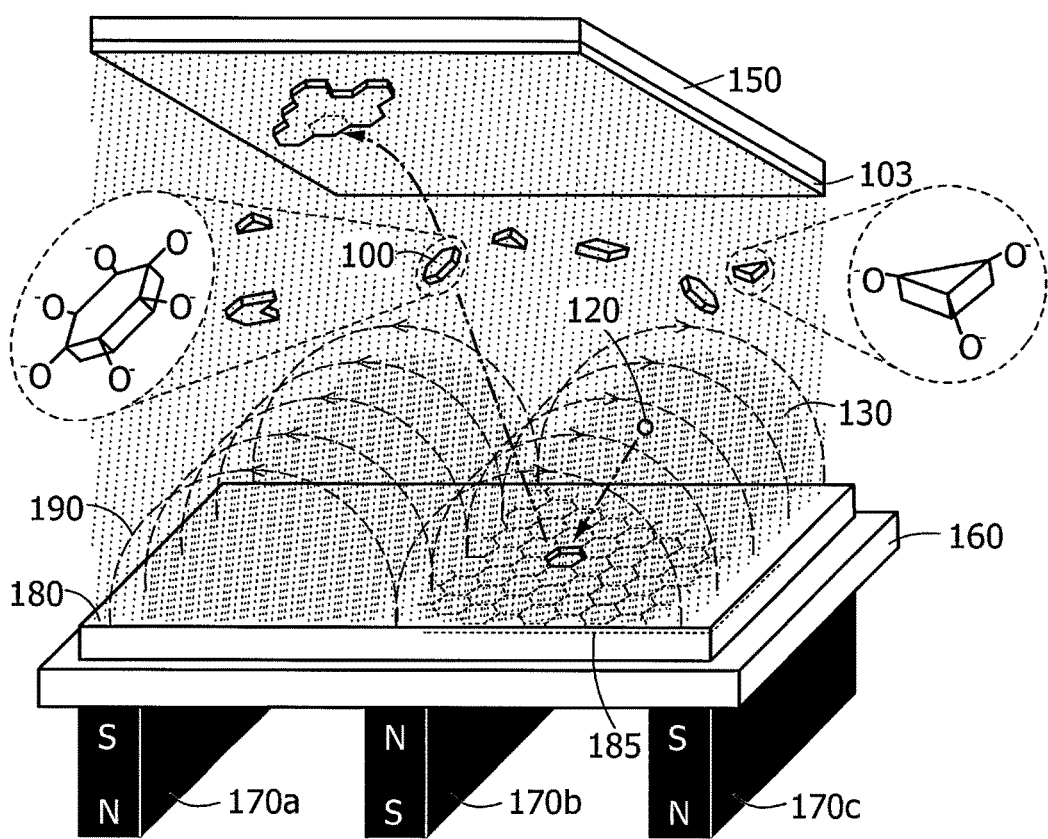
FIG. 14 is a schematic diagram illustrating a deposition model of a CAAC-OS film using a sputtering method.

FIG. 14 is a schematic diagram of a deposition chamber illustrating a state where the CAAC-OS film is formed by a sputtering method.

A target 180 is attached to a backing plate 160. Under the target 180 and the backing plate 160, a magnet 170a, a magnet 170b, and a magnet 170c are placed. The magnet 170a, the magnet 170b, and the magnet 170c generate a magnetic field represented by magnetic force lines 190 over the target 180. Although the magnet 170a and the magnet 170c each have an S pole on the backing plate 160 side and the magnet 170b has an N pole on the backing plate 160 side, one embodiment of the present invention is not limited thereto. For example, the magnet 170a and the magnet 170c each may have an N pole on the backing plate 160 side and the magnet 170b may have an S pole on the backing plate 160 side.

The target 180 has a cleavage plane 185. Although the target 180 has a plurality of cleavage planes 185, only one cleavage plane is shown here for easy understanding.

A substrate 150 is placed to face the target 180. The deposition chamber is mostly filled with a deposition gas (e.g., an oxygen gas, an argon gas, or a mixed gas containing oxygen at 50 vol % or higher) and controlled to a low pressure (approximately 0.1 Pa to 10 Pa). Here, discharge starts by applying a voltage at a constant value or higher to the target 180, and plasma is observed. Note that the magnetic field over the target 180 makes the region 130 to be a high-density plasma region. In the region 130, the deposition gas is ionized, so that an ion 120 is formed. Examples of the ion 120 include an oxygen cation (O$^+$) and an argon cation (Ar$^+$).

The ion 120 is accelerated to the target 180 side by an electric field, and collides with the target 180 eventually. At this time, a pellet 100 which is a flat-plate-like (pellet-like) sputtered particle is separated and sputtered from the cleavage plane 185.

The thickness of the pellet 100 is determined depending on the kind of the deposition gas and the like. Although the reasons are described later, the thicknesses of the pellets 100 are preferably uniform. In addition, the sputtered particle preferably has a pellet shape with a small thickness as compared to a dice shape with a large thickness.

The shape of a flat plane of the pellet 100 may be a triangle (regular triangle) or a shape formed of two to six triangles. For example, a square (rhombus) is formed by combining two triangles (regular triangles), and a hexagon (regular hexagon) is formed by combining six triangles (regular triangles). FIG. 14 shows examples of the pellets 100 having a regular triangular flat plane, a rhombus flat plane, a flat plane formed of two rhombuses, and a regular hexagonal flat plane as typical flat-plane shapes of the pellet 100.

The pellet 100 receives a charge from plasma when passing through the region 130, so that end portions thereof are negatively or positively charged in some cases. FIG. 14 also illustrates an enlarged view showing the case where the flat plane of the pellet 100 is a regular hexagon and an enlarged view showing the case where the flat plane of the pellet 100 is a regular triangle. As illustrated in the enlarged views, the end portions of the pellet 100 are terminated with oxygen and there is a possibility that the oxygen is negatively charged. The end portions of the pellet 100 are charged in the same polarity, so that charges repel each other; thus, the pellet 100 can maintain a flat-plate shape.

An assumed example of the movement of the sputtered pellet 100 until the sputtered pellet 100 reaches the substrate 150 is described. For example, the pellet 100 flies linearly in plasma. When the pellet 100 gets close to the substrate 150, repulsion is rapidly generated between the pellet 100 and the substrate 150. The repulsion between the pellet 100 and the substrate 150 is caused mainly because the pellet 100 is charged. For example, when the pellet 100 gets close to a region where another pellet 100 has already been deposited, these pellets 100 repel each other to generate repulsion. This repulsion makes the pellet 100 slightly float over the substrate 150. Here, in the case where the substrate 150 is heated to a high temperature (e.g., approximately 150° C. to 400° C.), the pellet 100 moves (migrates) over the substrate 150 with a gradually decreasing height. After that, when the pellet 100 reaches a side surface of another pellet 100 which has already been deposited, the side surfaces of the pellets 100 are weakly bonded to each other by intermolecular force. It is considered that by such a model, the pellets 100 are deposited over the substrate 150. Since the pellet 100 is placed so that its flat plane parallel to the a-b plane faces downward, a layer with a uniform thickness, flatness, and high crystallinity is formed. By stacking n layers (n is a natural number), a CAAC-OS film 103 can be obtained.

Another assumed example of the movement of the sputtered pellet 100 until the sputtered pellet 100 reaches the substrate 150 is described. For example, the pellet 100 flies like a kite in plasma and then flutters down over the substrate 150. Since the pellets 100 are charged, when the pellet 100 gets close to a region where another pellet 100 has already been deposited, repulsion is generated. Here, in the case where the substrate 150 is heated to a high temperature (e.g., approximately 150° C. to 400° C.), the pellet 100 glides (migrates) over the substrate 150 like a hang glider. After that, when the pellet 100 reaches a side surface of another pellet 100 which has already been deposited, the side surfaces of the pellets 100 are weakly bonded to each other by intermolecular force. It is considered that by such a model, the pellets 100 are deposited over the substrate 150. Since the pellet 100 is placed so that its flat plane parallel to the a-b plane faces downward, a layer with a uniform thickness, flatness, and high crystallinity is formed. By stacking n layers (n is a natural number), the CAAC-OS film 103 can be obtained.

Accordingly, the CAAC-OS film 103 does not need laser crystallization, and deposition can be uniformly performed even in the case of a large-sized glass substrate.

Since the CAAC-OS film 103 is deposited by such a model, the sputtered particle preferably has a pellet shape with a small thickness. Note that in the case where the sputtered particle has a dice shape with a large thickness, planes facing the substrate 150 are not uniform and thus, the thickness and the orientation of the crystals cannot be uniform in some cases.

In consideration of formation energy of oxygen vacancies (Vo), a damaged region might be formed in the pellet 100 by releasing oxygen adjacent to indium in sputtering. Therefore, in the case where the CAAC-OS film 103 having a high atomic ratio of indium is deposited, repairing a damaged region (filling oxygen vacancies) is important.

When the CAAC-OS film 103 is deposited using oxygen, a damaged region included in the pellet 100 is repaired over the substrate 150 in some cases by performing heat treatment under an oxygen atmosphere at the same timing as the deposition of the pellet 100. Further, a damaged region which is not repaired in the deposition of the pellet 100 can be repaired in some cases by performing heat treatment under an oxygen atmosphere or an atmosphere containing oxygen after the CAAC-OS film 103 is deposited. Note that it is preferable to perform heat treatment under a nitrogen atmosphere (higher than or equal to 250° C. and lower than or equal to 600° C., preferably higher than or equal to 400° C. and lower than or equal to 500° C.) before the heat treatment (higher than or equal to 250° C. and lower than or equal to 600° C., preferably higher than or equal to 400° C. and lower than or equal to 500° C.) is performed under an oxygen atmosphere or an atmosphere containing oxygen because a damaged region can be repaired while the hydrogen concentration in the CAAC-OS film 103 is decreased.

A damaged region in the CAAC-OS film 103 can be repaired by the above-described method. On the other hand, the CAAC-OS film 103 having good quality can be deposited in some cases because the pellet 100 includes a damaged region.

In the case where the pellet 100 includes a damaged region, a side surface of the pellet 100 might be stable In—O, or unstable In-Vo by releasing oxygen (O) from In—O and thus forming oxygen vacancies (Vo). In the case where such pellets 100 are bonded to each other, that is, Vo-In (the order of In and Vo is changed for convenience) gets close to In—O, O in In—O enters a Vo site in In-Vo, so that a stable In—O—In bond is obtained. Consequently, the pellets 100 are considered to be connected smoothly even when positions of the side surfaces are misaligned slightly. In the above manner, the CAAC-OS film 103 having good quality can be formed because the pellet 100 includes a damaged region.

Note that when the ion 120 collides with the target 180, there is a possibility that in addition to the pellet 100, an atom included in the target is sputtered; however, the mass of an atom is extremely lower than that of the pellet 100 and thus, it is considered that the atoms are mostly exhausted to the outside of the deposition chamber by a vacuum pump.

Although the deposition model of the CAAC-OS film 103 in the case where the target 180 includes an InGaZnO$_4$ crystal having a homologous structure is described above, the target 180 may have two or more structures. For example, a deposition model of the CAAC-OS film 103 in the case where the target 180 includes an InGaZnO$_4$ crystal having a homologous structure and ZnO is described below.

In the case where the target 180 includes an InGaZnO$_4$ crystal having a homologous structure and zinc oxide, a particle of zinc oxide reaches the substrate 150 first. The particle of zinc oxide which has reached the substrate 150 is crystallized by heating the substrate. Note that the crystal of zinc oxide becomes a hexagonal crystal. Thus, the crystallized zinc oxide forms a thin layer in which atoms are arranged in a hexagonal configuration (at least one atomic layer, preferably having a thickness of greater than or equal to 0.1 nm and less than or equal to 10 nm). The zinc oxide layer is sufficiently thin, and thus, a grain boundary is hardly observed.

Next, the pellet 100 of InGaZnO$_4$ is deposited on the thin zinc oxide layer. At this time, the zinc oxide layer has a hexagonal atomic arrangement so that the pellets 100 are exactly arranged on the hexagon. In other words, the zinc oxide layer serves as a lubricant for the CAAC-OS film 103. After that, the pellets 100 are deposited while a zinc oxide layer is formed by in-situ, so that a CAAC-OS film having high crystallinity (low DOS) can be deposited.

Note that in the case where the target 180 includes zinc oxide, there is a possibility that zinc oxide exists in a gap among the pellets illustrated in FIGS. 1A and 1B. At this time, the zinc oxide which exists in the gap among the pellets probably includes amorphous zinc oxide although it depends on the shape of the gap.

Further, a deposition model of the CAAC-OS film 103 in the case where the target 180 includes an InGaZnO$_4$ crystal having a homologous structure and an InGaZn$_2$O$_5$ crystal having a homologous structure is described below, for example. Note that the InGaZn$_2$O$_5$ crystal having a homologous structure has a structure in which one layer of Zn—O is added to the InGaZnO$_4$ crystal having a homologous structure.

In the case where the target 180 includes the InGaZnO$_4$ crystal having a homologous structure and the InGaZn$_2$O$_5$ crystal having a homologous structure, the pellet 100 formed of the InGaZnO$_4$ crystal and the pellet 100 formed of the InGaZn$_2$O$_5$ crystal reach the substrate 150. The pellet 100 of InGaZnO$_4$ which reaches the substrate 150 is considered to be deposited as in the above-described model.

On the other hand, the pellet 100 of InGaZn$_2$O$_5$ has a shape in which a Zn—O layer, a Ga—Zn—O layer, an In—O layer, and a Ga—Zn—O layer are stacked in this order. Although the pellet 100 of InGaZn$_2$O$_5$ reaches the substrate 150 as in the case of the pellet 100 of InGaZnO$_4$, the Zn—O layer is gasified and exhausted because the substrate 150 is at a high temperature. Thus, the pellet 100 of InGaZn$_2$O$_5$ also has a shape similar to that of the pellet 100 of InGaZnO$_4$ (shape in which a Ga—Zn—O layer, an In—O layer, and a Ga—Zn—O layer are stacked in this order) when deposited on the substrate 150.

In other words, also in the case where the target 180 includes the InGaZnO$_4$ crystal and the InGaZn$_2$O$_5$ crystal, it is possible to deposit the CAAC-OS film 103 which is similar to that formed in the case where the target 180 includes the InGaZnO$_4$ crystal.

Note that in the case where the target 180 has a structure of an In—Ga—Zn oxide which does not have a homologous structure (e.g., a spinel structure in which indium substitutes for part of gallium), the CAAC-OS film 103 cannot be deposited in some cases.

For example, in the case where not only the pellet 100 but also a crystalline particle separated from a spinel structure is deposited on the substrate 150, the spinel structure is included in a film to be deposited. Consequently, properties might not be uniform in the film, and favorable electrical characteristics cannot be obtained in some cases even when the film is used as a semiconductor film of a transistor.

Accordingly, it is preferable that the target 180 do not have a structure of an In—Ga—Zn oxide which is not a homologous structure (e.g., a spinel structure) or have the structure at a low proportion. For example, it is preferable that the proportion of the structure of the In—Ga—Zn oxide which is not a homologous structure (e.g., a spinel structure) in the entire target 180 be lower than 10 vol %, preferably lower than 5 vol %, more preferably lower than 2 vol %, still more preferably lower than 1 vol %.

Further, the target 180 preferably contains a certain amount or more of indium. As described above, the pellet 100 has the shape in which an In—O layer is sandwiched between Ga—Zn—O layers or the like. In other words, the In—O layer serves as a core of the pellet 100. Accordingly, in the case where there is no In—O layer, the pellet 100 is difficult to maintain its shape and thus might become a deposition particle (deposition dust). For example, the proportion of indium contained in the entire target 180 is 1 atomic % or higher, preferably 2 atomic % or higher, more preferably 5 atomic % or higher, still more preferably 10 atomic % or higher.

In the case where the CAAC-OS film is used as a semiconductor film of a transistor and for example, the target 180 having the atomic ratio of metal elements of In:Ga:Zn=$x_1$:$y_1$:$z_1$ is used, $x_1/y_1$ is preferably greater than or equal to ⅓ and less than or equal to 6, more preferably greater than or equal to 1 and less than or equal to 6, and $z_1/y_1$ is preferably greater than or equal to ⅓ and less than or equal to 6, more preferably greater than or equal to 1 and less than or equal to 6. Note that when $z_1/y_1$ is greater than or equal to 1 and less than or equal to 6, a CAAC-OS film is easily formed. Typical examples of the atomic ratio of the metal elements of the target are In:Ga:Zn=1:1:1, In:Ga:Zn=3:1:2, and In:Ga:Zn=5:5:6.

Alternatively, in the case where the CAAC-OS film is used as an oxide semiconductor film which protects a semiconductor film of a transistor and the target 180 having the atomic ratio of metal elements of In:Ga:Zn=$x_2$:$y_2$:$z_2$ is used, $x_2/y_2$ is preferably less than $x_1/y_1$, and $z_2/y_2$ is preferably greater than or equal to ⅓ and less than or equal to 6, more preferably greater than or equal to 1 and less than or equal to 6. Note that when $z_2/y_2$ is greater than or equal to 1 and less than or equal to 6, a CAAC-OS film is easily formed. Typical examples of the atomic ratio of the metal elements of the target are In:Ga:Zn=1:3:2, In:Ga:Zn=1:3:3, In:Ga:Zn=1:3:4, In:Ga:Zn=1:3:6, In:Ga:Zn=1:3:8, and In:Ga:Zn=1:6:4.

Further, the target 180 preferably has high crystallinity. Reducing the impurity concentration in the target 180 is effective to obtain high crystallinity. For example, the purity of the target 180 is preferably 3N or more, more preferably 4N or more, still more preferably 5N or more, further still more preferably 6N or more. In particular, silicon is preferably reduced as much as possible because silicon decreases the crystallinity of the target 180, and deteriorates electrical characteristics and decreases reliability of a transistor in the case where an In—Ga—Zn oxide film is used as a semiconductor film of the transistor. Specifically, the concentration of silicon in the target 180 is preferably set to lower than 50 ppm by weight, more preferably lower than 20 ppm by weight, still more preferably lower than 10 ppm by weight, further still more preferably lower than 5 ppm by weight.

Note that the concentration of each of alkali metals in the target 180 is preferably lower than 10 ppm by weight, more preferably lower than 5 ppm by weight, still more preferably lower than 2 ppm by weight. The concentration of each of alkaline earth metals is preferably lower than 5 ppm by weight, more preferably lower than 2 ppm by weight, still more preferably lower than 1 ppm by weight. The concentration of each of halogen elements is preferably lower than 10 ppm by weight, more preferably lower than 5 ppm by weight, still more preferably lower than 2 ppm by weight. The concentration of each of boron, magnesium, phosphorus, copper, and germanium is preferably lower than 5 ppm by weight, more preferably lower than 2 ppm by weight, still more preferably lower than 1 ppm by weight. The concentration of nitrogen is preferably lower than 20 ppm by weight, more preferably lower than 10 ppm by weight, still more preferably lower than 5 ppm by weight, further still more preferably lower than 2 ppm by weight. Note that the concentration of impurities can be measured by secondary ion mass spectrometry (SIMS), glow discharge mass spectrometry (GDMS), inductively coupled plasma mass spectrometry (ICP-MS), or the like.

According to the above-described deposition model, a CAAC-OS film having high crystallinity can be obtained. Further, it is found that the CAAC-OS film can be deposited not only on a flat surface at an atomic size level but also a convex surface in principle.

<Deposition Apparatus>

A deposition apparatus with which the above-described CAAC-OS film can be deposited is described below.

First, a structure of a deposition apparatus which allows the entry of few impurities into a film at the time of the deposition is described with reference to FIG. 15 and FIGS. 16A to 16C.

Figure 15:
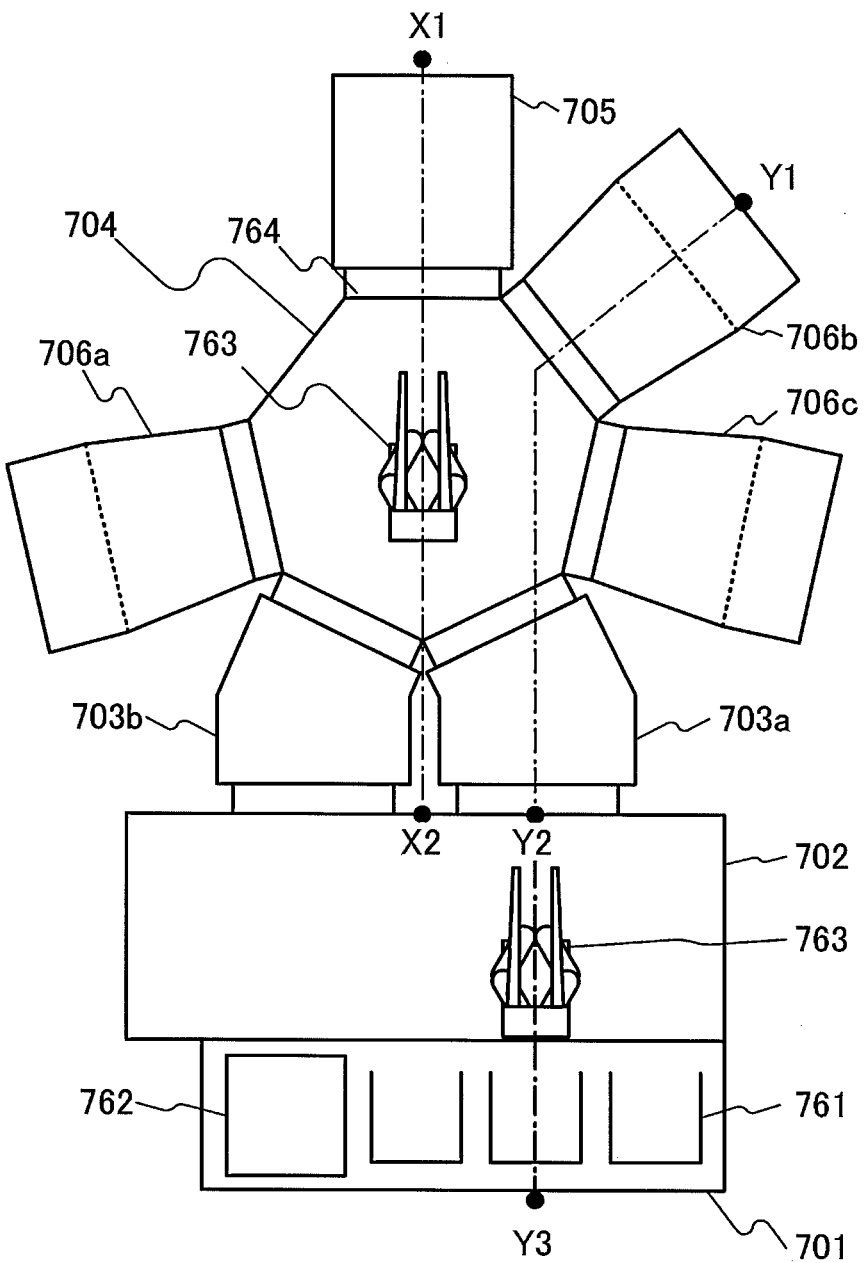
FIG. 15 is a top view illustrating an example of a deposition apparatus.

FIG. 15 is a top view schematically illustrating a single wafer multi-chamber deposition apparatus 700. The deposition apparatus 700 includes an atmosphere-side substrate supply chamber 701 including a cassette port 761 for holding a substrate and an alignment port 762 for performing alignment of a substrate, an atmosphere-side substrate transfer chamber 702 through which a substrate is transferred from the atmosphere-side substrate supply chamber 701, a load lock chamber 703*a* where a substrate is carried and the pressure inside the chamber is switched from atmospheric pressure to reduced pressure or from reduced pressure to atmospheric pressure, an unload lock chamber 703*b* where a substrate is carried out and the pressure inside the chamber is switched from reduced pressure to atmospheric pressure or from atmospheric pressure to reduced pressure, a transfer chamber 704 through which a substrate is transferred in a vacuum, a substrate heating chamber 705 where a substrate is heated, and deposition chambers 706*a*, 706*b*, and 706*c* in each of which a target is placed for deposition.

Note that a plurality of cassette ports 761 may be provided as illustrated in FIG. 15 (in FIG. 15, three cassette ports 761 are provided).

The atmosphere-side substrate transfer chamber 702 is connected to the load lock chamber 703*a* and the unload lock chamber 703*b*, the load lock chamber 703*a* and the unload lock chamber 703*b* are connected to the transfer chamber 704, and the transfer chamber 704 is connected to the substrate heating chamber 705 and the deposition chambers 706*a*, 706*b*, and 706*c*.

Gate valves 764 are provided for connecting portions between chambers so that each chamber except the atmosphere-side substrate supply chamber 701 and the atmosphere-side substrate transfer chamber 702 can be independently kept under vacuum. Moreover, the atmosphere-side substrate transfer chamber 702 and the transfer chamber 704 each include a transfer robot 763, with which a glass substrate can be transferred.

Further, it is preferable that the substrate heating chamber 705 also serve as a plasma treatment chamber. In the deposition apparatus 700, it is possible to transfer a substrate without exposure to the air between treatment and treatment; therefore, adsorption of impurities on a substrate can be suppressed. In addition, the order of deposition, heat treatment, or the like can be freely determined. Note that the number of the transfer chambers, the number of the deposition chambers, the number of the load lock chambers, the number of the unload lock chambers, and the number of the substrate heating chambers are not limited to the above, and the numbers thereof can be set as appropriate depending on the space for placement or the process conditions.

Figure 16A:
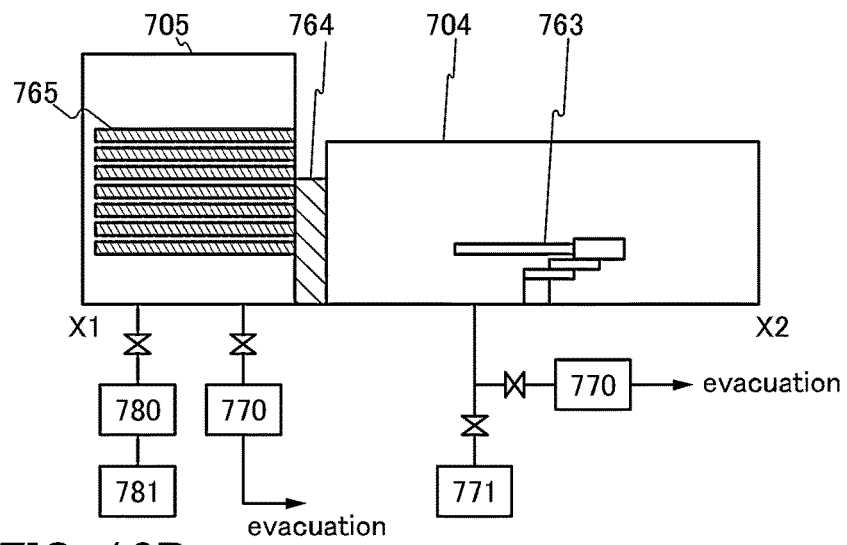
FIGS. 16A to 16C illustrate a structure example of a deposition apparatus.
Figure 16B:
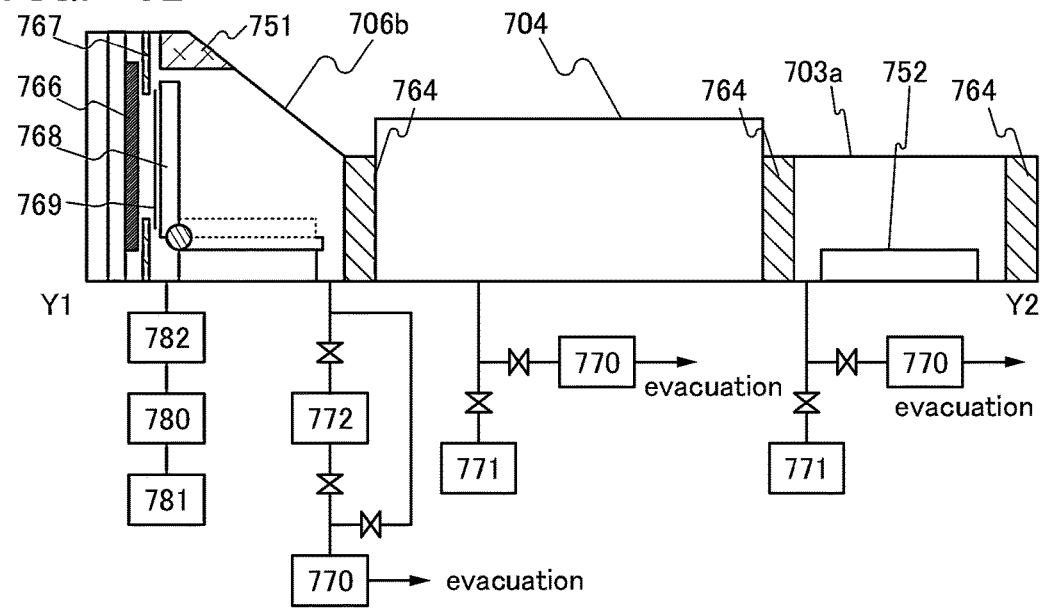
Figure 16C:
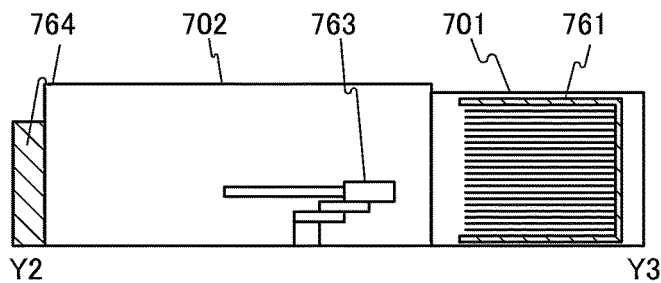

Next, FIG. 16A, FIG. 16B, and FIG. 16C are a cross-sectional view taken along dashed-dotted line X1-X2, a cross-sectional view taken along dashed-dotted line Y1-Y2, and a cross-sectional view taken along dashed-dotted line Y2-Y3, respectively, in the deposition apparatus 700 illustrated in FIG. 15.

FIG. 16A is a cross section of the substrate heating chamber 705 and the transfer chamber 704, and the substrate heating chamber 705 includes a plurality of heating stages 765 which can hold a substrate. Note that although the number of heating stages 765 illustrated in FIG. 16A is seven, it is not limited thereto and may be greater than or equal to one and less than seven, or greater than or equal to eight. It is preferable to increase the number of the heating stages 765 because a plurality of substrates can be subjected to heat treatment at the same time, which leads to an increase in productivity. Further, the substrate heating chamber 705 is connected to a vacuum pump 770 through a valve. As the vacuum pump 770, a dry pump and a mechanical booster pump can be used, for example.

As heating mechanism which can be used for the substrate heating chamber 705, a resistance heater may be used for heating, for example. Alternatively, heat conduction or heat radiation from a medium such as a heated gas may be used as the heating mechanism. For example, rapid thermal annealing (RTA) such as gas rapid thermal annealing (GRTA) or lamp rapid thermal annealing (LRTA) can be used. The LRTA is a method for heating an object by radiation of light (an electromagnetic wave) emitted from a lamp such as a halogen lamp, a metal halide lamp, a xenon arc lamp, a carbon arc lamp, a high-pressure sodium lamp, or a high-pressure mercury lamp. In the GRTA, heat treatment is performed using a high-temperature gas. An inert gas is used as the gas.

Moreover, the substrate heating chamber 705 is connected to a refiner 781 through a mass flow controller 780. Note that although the mass flow controller 780 and the refiner 781 can be provided for each of a plurality of kinds of gases, only one mass flow controller 780 and one refiner 781 are provided for easy understanding. As the gas introduced to the substrate heating chamber 705, a gas whose dew point is −80° C. or lower, preferably −100° C. or lower can be used; for example, an oxygen gas, a nitrogen gas, and a rare gas (e.g., an argon gas) are used.

The transfer chamber 704 includes the transfer robot 763. The transfer robot 763 includes a plurality of movable portions and an arm for holding a substrate and can transfer a substrate to each chamber. Further, the transfer chamber 704 is connected to the vacuum pump 770 and a cryopump 771 through valves. With such a structure, evacuation can be performed using the vacuum pump 770 when the pressure inside the transfer chamber 704 is in the range of atmospheric pressure to low or medium vacuum (about 0.1 Pa to several hundred Pa) and then, by switching the valves, evacuation can be performed using the cryopump 771 when the pressure inside the transfer chamber 704 is in the range of middle vacuum to high or ultra-high vacuum (0.1 Pa to $1\times10^{-7}$ Pa).

Alternatively, two or more cryopumps 771 may be connected in parallel to the transfer chamber 704. With such a structure, even when one of the cryopumps is in regeneration, evacuation can be performed using any of the other cryopumps. Note that the above regeneration refers to treatment for discharging molecules (or atoms) entrapped in the cryopump. When molecules (or atoms) are entrapped too much in a cryopump, the evacuation capability of the cryopump is lowered; therefore, regeneration is performed regularly.

FIG. 16B is a cross section of the deposition chamber 706b, the transfer chamber 704, and the load lock chamber 703a.

Here, the details of the deposition chamber (sputtering chamber) are described with reference to FIG. 16B. The deposition chamber 706b illustrated in FIG. 16B includes a target 766, an attachment protection plate 767, and a substrate stage 768. Note that here, a substrate 769 is provided on the substrate stage 768. Although not illustrated, the substrate stage 768 may include a substrate holding mechanism which holds the substrate 769, a rear heater which heats the substrate 769 from the back surface, or the like.

Note that the substrate stage 768 is held substantially vertically to a floor during deposition and is held substantially parallel to the floor when the substrate is delivered. In FIG. 16B, the position where the substrate stage 768 is held when the substrate is delivered is denoted by a dashed line. With such a structure, the probability that dust or a particle which might be mixed in to a film during the deposition is attached to the substrate 769 can be suppressed as compared with the case where the substrate stage 768 is held parallel to the floor. However, there is a possibility that the substrate 769 falls when the substrate stage 768 is held vertically) (90° to the floor; therefore, the angle of the substrate stage 768 to the floor is preferably wider than or equal to 80° and narrower than 90°.

The attachment protection plate 767 can suppress deposition of a particle which is sputtered from the target 766 on a region where deposition is not needed. Moreover, the attachment protection plate 767 is preferably processed to prevent accumulated sputtered particles from being separated. For example, blasting treatment which increases surface roughness may be performed, or roughness may be formed on the surface of the attachment protection plate 767.

The deposition chamber 706b is connected to a mass flow controller 780 through a gas heating system 782, and the gas heating system 782 is connected to a refiner 781 through the mass flow controller 780. With the gas heating system 782, a gas which is introduced to the deposition chamber 706b can be heated to a temperature higher than or equal to 40° C. and lower than or equal to 400° C., preferably higher than or equal to 50° C. and lower than or equal to 200° C. Note that although the gas heating system 782, the mass flow controller 780, and the refiner 781 can be provided for each of a plurality of kinds of gases, only one gas heating system 782, one mass flow controller 780, and one refiner 781 are provided for easy understanding. As the gas introduced to the deposition chamber 706b, a gas whose dew point is −80° C. or lower, preferably −100° C. or lower can be used; for example, an oxygen gas, a nitrogen gas, and a rare gas (e.g., an argon gas) are used.

A facing-target-type sputtering apparatus may be provided in the deposition chamber 706b. In a facing-target-type sputtering apparatus, plasma is confined between targets; therefore, plasma damage to a substrate can be reduced. Further, step coverage can be improved because an incident angle of a sputtered particle to the substrate can be made smaller depending on the inclination of the target.

Note that a parallel-plate-type sputtering apparatus or an ion beam sputtering apparatus may be provided in the deposition chamber 706b.

In the case where the refiner is provided just before the gas is introduced, the length of a pipe between the refiner and the deposition chamber 706b is less than or equal to 10 m, preferably less than or equal to 5 m, more preferably less than or equal to 1 m. When the length of the pipe is less than or equal to 10 m, less than or equal to 5 m, or less than or equal to 1 m, the effect of the release of gas from the pipe can be reduced accordingly. As the pipe for the gas, a metal pipe the inside of which is covered with iron fluoride, aluminum oxide, chromium oxide, or the like can be used. With the above pipe, the amount of released gas containing impurities is made small and the entry of impurities into the gas can be reduced as compared with a SUS316L-EP pipe, for example. Further, a high-performance ultra-compact metal gasket joint (UPG joint) may be used as a joint of the pipe. A structure where all the materials of the pipe are metals is preferable because the effect of the generated released gas or the external leakage can be reduced as compared with a structure where resin or the like is used.

The deposition chamber 706b is connected to a turbo molecular pump 772 and a vacuum pump 770 through valves.

In addition, the deposition chamber 706b is provided with a cryotrap 751.

The cryotrap 751 is a mechanism which can adsorb a molecule (or an atom) having a relatively high melting point, such as water. The turbo molecular pump 772 is capable of stably evacuating a large-sized molecule (or atom), needs low frequency of maintenance, and thus enables high productivity, whereas it has a low capability in evacuating hydrogen and water. Hence, the cryotrap 751 is connected to the deposition chamber 706b so as to have a high capability in evacuating water or the like. The temperature of a refrigerator of the cryotrap 751 is set to be lower than or equal to 100 K, preferably lower than or equal to 80 K. In the case where the cryotrap 751 includes a plurality of refrigerators, it is preferable to set the temperature of each refrigerator at a different temperature because efficient evacuation is possible. For example, the temperature of a first-stage refrigerator may be set to be lower than or equal to 100 K and the temperature of a second-stage refrigerator may be set to be lower than or equal to 20 K.

Note that the evacuation method of the deposition chamber 706b is not limited to the above, and a structure similar to that in the evacuation method described in the transfer chamber 704 (the evacuation method using the cryopump and the vacuum pump) may be employed. Needless to say, the evacuation method of the transfer chamber 704 may have a structure similar to that of the deposition chamber 706b (the evacuation method using the turbo molecular pump and the vacuum pump).

Note that in each of the transfer chamber 704, the substrate heating chamber 705, and the deposition chamber 706b which are described above, the back pressure (total pressure) and the partial pressure of each gas molecule (atom) are preferably set as follows. In particular, the back pressure and the partial pressure of each gas molecule (atom) in the deposition chamber 706b need to be noted because impurities might enter a film to be formed.

In each of the above chambers, the back pressure (total pressure) is less than or equal to $1\times10^{-4}$ Pa, preferably less than or equal to $3\times10^{-5}$ Pa, more preferably less than or equal to $1\times10^{-5}$ Pa. In each of the above chambers, the partial pressure of a gas molecule (atom) having a mass-to-charge ratio (m/z) of 18 is less than or equal to $3\times10^{-5}$ Pa, preferably less than or equal to $1\times10^{-5}$ Pa, more preferably less than or equal to $3\times10^{-6}$ Pa. Moreover, in each of the above chambers, the partial pressure of a gas molecule (atom) having a mass-to-charge ratio (m/z) of 28 is less than or equal to $3\times10^{-5}$ Pa, preferably less than or equal to $1\times10^{-5}$ Pa, more preferably less than or equal to $3\times10^{-6}$ Pa. Further, in each of the above chambers, the partial pressure of a gas molecule (atom) having a mass-to-charge ratio (m/z) of 44 is less than or equal to $3\times10^{-5}$ Pa, preferably less than or equal to $1\times10^{-5}$ Pa, more preferably less than or equal to $3\times10^{-6}$ Pa.

Note that a total pressure and a partial pressure in a vacuum chamber can be measured using a mass analyzer. For example, Qulee CGM-051, a quadrupole mass analyzer (also referred to as Q-mass) manufactured by ULVAC, Inc. may be used.

Moreover, the transfer chamber 704, the substrate heating chamber 705, and the deposition chamber 706b which are described above preferably have a small amount of external leakage or internal leakage.

For example, in each of the transfer chamber 704, the substrate heating chamber 705, and the deposition chamber 706b which are described above, the leakage rate is less than or equal to $3\times10^{-6}$ Pa·m$^3$/s, preferably less than or equal to $1\times10^{-6}$ Pa·m$^3$/s. The leakage rate of a gas molecule (atom) having a mass-to-charge ratio (m/z) of 18 is less than or equal to $1\times10^{-7}$ Pa·m$^3$/s, preferably less than or equal to $3\times10^{-8}$ Pa·m$^3$/s. The leakage rate of a gas molecule (atom) having a mass-to-charge ratio (m/z) of 28 is less than or equal to $1\times10^{-5}$ Pa·m$^3$/s, preferably less than or equal to $1\times10^{-6}$ Pa·m$^3$/s. The leakage rate of a gas molecule (atom) having a mass-to-charge ratio (m/z) of 44 is less than or equal to $3\times10^{-6}$ Pa·m$^3$/s, preferably less than or equal to $1\times10^{-6}$ Pa·m$^3$/s.

Note that a leakage rate can be derived from the total pressure and partial pressure measured using the mass analyzer.

The leakage rate depends on external leakage and internal leakage. The external leakage refers to inflow of gas from the outside of a vacuum system through a minute hole, a sealing defect, or the like. The internal leakage is due to leakage through a partition, such as a valve, in a vacuum system or due to released gas from an internal member. Measures need to be taken from both aspects of external leakage and internal leakage in order that the leakage rate is set to be less than or equal to the above value.

For example, an open/close portion of the deposition chamber 706b can be sealed with a metal gasket. For the metal gasket, metal covered with iron fluoride, aluminum oxide, or chromium oxide is preferably used. The metal gasket realizes higher adhesion than an O-ring, and can reduce the external leakage. Further, with the use of the metal covered with iron fluoride, aluminum oxide, chromium oxide, or the like, which is in the passive state, the release of gas containing impurities released from the metal gasket is suppressed, so that the internal leakage can be reduced.

For a member of the deposition apparatus 700, aluminum, chromium, titanium, zirconium, nickel, or vanadium, which releases a smaller amount of gas containing impurities, is used. Alternatively, for the above member, an alloy containing iron, chromium, nickel, and the like covered with the above material may be used. The alloy containing iron, chromium, nickel, and the like is rigid, resistant to heat, and suitable for processing. Here, when surface unevenness of the member is decreased by polishing or the like to reduce the surface area, the release of gas can be reduced.

Alternatively, the above member of the deposition apparatus 700 may be covered with iron fluoride, aluminum oxide, chromium oxide, or the like.

The member of the deposition apparatus 700 is preferably formed with only metal as much as possible. For example, in the case where a viewing window formed with quartz or the like is provided, it is preferable that the surface of the viewing window be thinly covered with iron fluoride, aluminum oxide, chromium oxide, or the like so as to suppress release of gas.

When an adsorbed substance is present in the deposition chamber, the adsorbed substance does not affect the pressure in the deposition chamber because it is adsorbed onto an inner wall or the like; however, the adsorbed substance causes gas to be released when the inside of the deposition chamber is evacuated. Therefore, although there is no correlation between the leakage rate and the evacuation rate, it is important that the adsorbed substance present in the deposition chamber be desorbed as much as possible and evacuation be performed in advance with the use of a pump with high evacuation capability. Note that the deposition chamber may be subjected to baking to promote desorption of the adsorbed substance. By the baking, the desorption rate of the adsorbed substance can be increased about tenfold. The baking can be performed at a temperature in the range of 100° C. to 450° C. At this time, when the adsorbed substance is removed while an inert gas is introduced to the deposition chamber, the desorption rate of water or the like, which is difficult to be desorbed simply by evacuation, can be further increased. Note that when the inert gas which is introduced is heated to substantially the same temperature as the baking temperature of the deposition chamber, the desorption rate of the adsorbed substance can be further increased. Here, a rare gas is preferably used as an inert gas. Depending on the kind of a film to be deposited, oxygen or the like may be used instead of an inert gas. For example, in the case of depositing an oxide, the use of oxygen which is the main component of the oxide is preferable in some cases.

Alternatively, treatment for evacuating the inside of the deposition chamber is preferably performed a certain period of time after heated oxygen, a heated inert gas such as a heated rare gas, or the like is introduced to increase a pressure in the deposition chamber. The introduction of the heated gas can desorb the adsorbed substance in the deposition chamber, and the impurities present in the deposition chamber can be reduced. Note that an advantageous effect can be achieved when this treatment is repeated more than or equal to 2 times and less than or equal to 30 times, preferably more than or equal to 5 times and less than or equal to 15 times. Specifically, an inert gas, oxygen, or the like with a temperature higher than or equal to 40° C. and lower than or equal to 400° C., preferably higher than or equal to 50° C. and lower than or equal to 200° C. is introduced to the deposition chamber, so that the pressure therein can be kept to be greater than or equal to 0.1 Pa and less than or equal to 10 kPa, preferably greater than or equal to 1 Pa and less than or equal to 1 kPa, more preferably greater than or equal to 5 Pa and less than or equal to 100 Pa in the time range of 1 minute to 300 minutes, preferably 5 minutes to 120 minutes. After that, the inside of the deposition chamber is evacuated in the time range of 5 minutes to 300 minutes, preferably 10 minutes to 120 minutes.

The desorption rate of the adsorbed substance can be further increased also by dummy deposition. Here, the dummy deposition refers to deposition on a dummy substrate by a sputtering method or the like, in which a film is deposited on the dummy substrate and the inner wall of the deposition chamber so that impurities in the deposition chamber and an adsorbed substance on the inner wall of the deposition chamber are confined in the film. For a dummy substrate, a substrate which releases a smaller amount of gas is preferably used. By performing dummy deposition, the concentration of impurities in a film which will be deposited later can be reduced. Note that the dummy deposition may be performed at the same time as the baking of the deposition chamber.

Next, the details of the transfer chamber 704 and the load lock chamber 703a illustrated in FIG. 16B and the atmosphere-side substrate transfer chamber 702 and the atmosphere-side substrate supply chamber 701 illustrated in FIG. 16C are described. Note that FIG. 16C is a cross section of the atmosphere-side substrate transfer chamber 702 and the atmosphere-side substrate supply chamber 701.

For the transfer chamber 704 illustrated in FIG. 16B, the description of the transfer chamber 704 illustrated in FIG. 16A can be referred to.

The load lock chamber 703a includes a substrate delivery stage 752. When a pressure in the load lock chamber 703a becomes atmospheric pressure by being increased from reduced pressure, the substrate delivery stage 752 receives a substrate from the transfer robot 763 provided in the atmosphere-side substrate transfer chamber 702. After that, the load lock chamber 703a is evacuated into vacuum so that the pressure therein becomes reduced pressure and then the transfer robot 763 provided in the transfer chamber 704 receives the substrate from the substrate delivery stage 752.

Further, the load lock chamber 703a is connected to the vacuum pump 770 and the cryopump 771 through valves. For a method for connecting evacuation systems such as the vacuum pump 770 and the cryopump 771, the description of the method for connecting the transfer chamber 704 can be referred to, and the description thereof is omitted here. Note that the unload lock chamber 703b illustrated in FIG. 15 can have a structure similar to that in the load lock chamber 703a.

The atmosphere-side substrate transfer chamber 702 includes the transfer robot 763. The transfer robot 763 can deliver a substrate from the cassette port 761 to the load lock chamber 703a or deliver a substrate from the load lock chamber 703a to the cassette port 761. Further, a mechanism for suppressing entry of dust or a particle, such as high efficiency particulate air (HEPA) filter, may be provided above the atmosphere-side substrate transfer chamber 702 and the atmosphere-side substrate supply chamber 701.

The atmosphere-side substrate supply chamber 701 includes a plurality of cassette ports 761. The cassette port 761 can hold a plurality of substrates.

The surface temperature of the target is set to be lower than or equal to 100° C., preferably lower than or equal to 50° C., more preferably about room temperature (typically, 25° C.). In a sputtering apparatus for a large substrate, a large target is often used. However, it is difficult to form a target for a large substrate without a juncture. In fact, a plurality of targets are arranged so that there is as little space as possible therebetween to obtain a large shape; however, a slight space is inevitably generated. When the surface temperature of the target increases, in some cases, zinc or the like is volatilized from such a slight space and the space might be expanded gradually. When the space expands, a metal of a backing plate or a metal used for adhesion might be sputtered and might cause an increase in impurity concentration. Thus, it is preferable that the target be cooled sufficiently.

Specifically, for the backing plate, a metal having high conductivity and a high heat dissipation property (specifically copper) is used. The target can be cooled efficiently by making a sufficient amount of cooling water flow through a water channel which is formed in the backing plate.

Note that in the case where the target includes zinc, plasma damage is alleviated by the deposition in an oxygen gas atmosphere; thus, an oxide film in which zinc is unlikely to be volatilized can be obtained.

Specifically, the concentration of hydrogen in the CAAC-OS film, which is measured by secondary ion mass spectrometry (SIMS), can be set to be lower than or equal to $2\times10^{20}$ atoms/cm$^3$, preferably lower than or equal to $5\times10^{19}$ atoms/cm$^3$, more preferably lower than or equal to $1\times10^{19}$ atoms/cm$^3$, still more preferably lower than or equal to $5\times10^{18}$ atoms/cm$^3$.

The concentration of nitrogen in the CAAC-OS film, which is measured by SIMS, can be set to be lower than $5\times10^{19}$ atoms/cm$^3$, preferably lower than or equal to $5\times10^{18}$ atoms/cm$^3$, more preferably lower than or equal to $1\times10^{18}$ atoms/cm$^3$, still more preferably lower than or equal to $5\times10^{17}$ atoms/cm$^3$.

The concentration of carbon in the CAAC-OS film, which is measured by SIMS, can be set to be lower than $5\times10^{19}$ atoms/cm$^3$, preferably lower than or equal to $5\times10^{18}$ atoms/cm$^3$, more preferably lower than or equal to $1\times10^{18}$ atoms/cm$^3$, still more preferably lower than or equal to $5\times10^{17}$ atoms/cm$^3$.

The amount of each of the following gas molecules (atoms) released from the CAAC-OS film can be less than or equal to $1\times10^{19}$/cm$^3$, preferably less than or equal to $1\times10^{18}$/cm$^3$, which is measured by thermal desorption spectroscopy (TDS) analysis: a gas molecule (atom) having a mass-to-charge ratio (m/z) of 2 (e.g., hydrogen molecule), a gas molecule (atom) having a mass-to-charge ratio (m/z) of 18, a gas molecule (atom) having a mass-to-charge ratio (m/z) of 28, and a gas molecule (atom) having a mass-to-charge ratio (m/z) of 44.

With the above deposition apparatus, entry of impurities into the CAAC-OS film can be suppressed. Further, when a film in contact with the CAAC-OS film is formed with the use of the above deposition apparatus, the entry of impurities into the CAAC-OS film from the film in contact therewith can be suppressed.

EXAMPLE 1

The CAAC-OS film is a semiconductor film suitable for a transistor and the like. In this example, an example where the CAAC-OS film is used as a semiconductor film of a transistor is shown.

Note that for comparison, Comparison Sample in which a polycrystalline OS film is used as the semiconductor film is provided over the same substrate as the CAAC-OS film.

A method for fabricating Example Sample and Comparison Sample is described below with reference to FIGS. 17A to 17D and FIGS. 18A to 18C.

First, a 300-nm-thick silicon oxide film was formed over a glass substrate and an upper surface thereof was planarized by a chemical mechanical polishing (CMP) method. Next, a 10-nm-thick aluminum oxide film was deposited (see FIG. 17A). Note that the aluminum oxide film was provided to prevent the silicon oxide film from being melted and mixed with a semiconductor film (here, the CAAC-OS film) by laser beam irradiation in a later step.

Figure 17A:
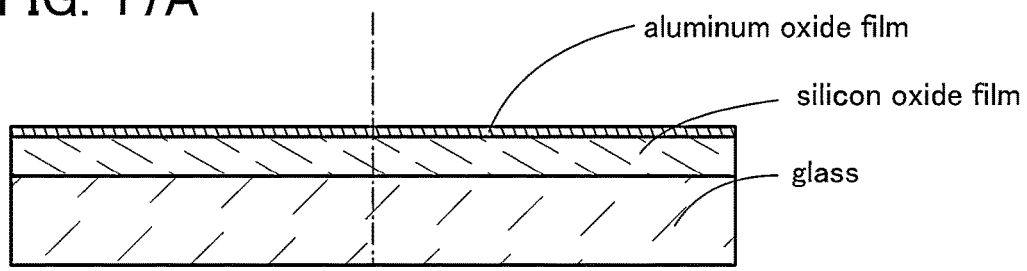
FIGS. 17A to 17D are cross-sectional views illustrating a method for fabricating samples.
Figure 17B:
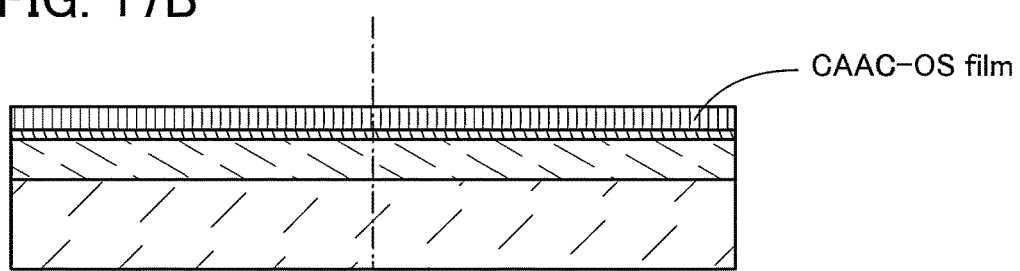

Next, the CAAC-OS film was deposited by the method described in the embodiment (see FIG. 17B).

Figure 17C:
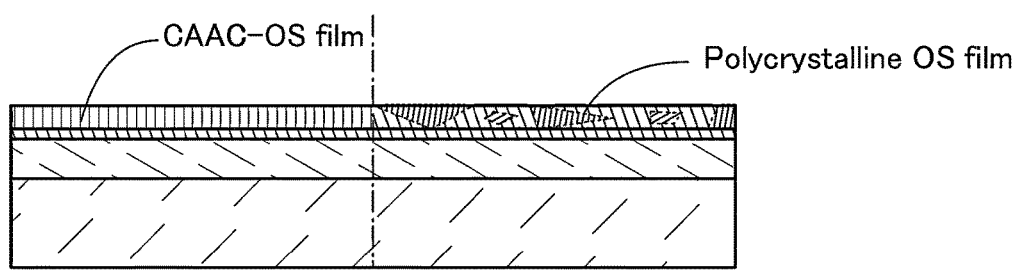

Next, part of the CAAC-OS film was irradiated with a laser beam having an energy density of 391 mJ/m$^2$ so that part of the CAAC-OS film was changed into a polycrystalline OS film (see FIG. 17C). Note that an excimer laser apparatus having an emission wavelength of 308 nm was used for the laser beam irradiation.

Figure 17D:
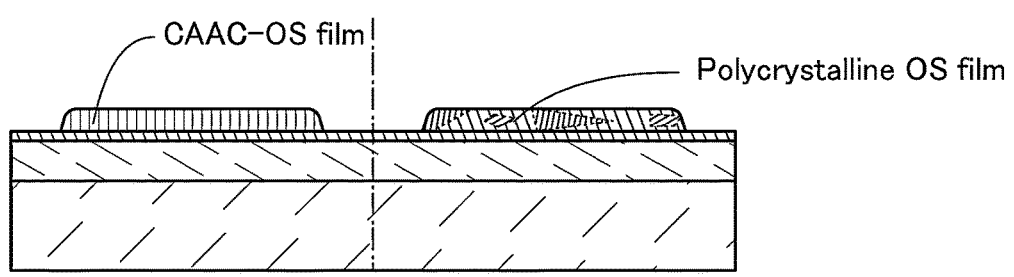

Next, the CAAC-OS film and the polycrystalline OS film were processed to each have an island shape (see FIG. 17D).

As a source electrode and a drain electrode, a 100-nm-thick tungsten film was formed. Then, as a gate insulating film, a 100-nm-thick silicon oxide film was deposited (see FIG. 18A).

Figure 18A:
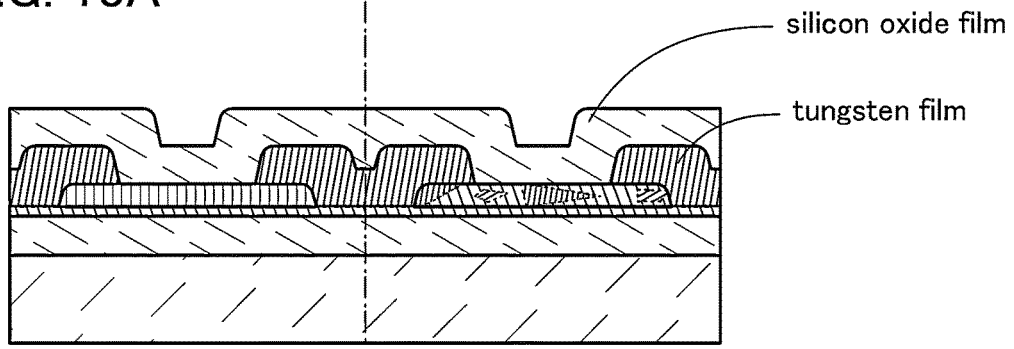
FIGS. 18A to 18C are cross-sectional views illustrating a method for fabricating samples.
Figure 18B:
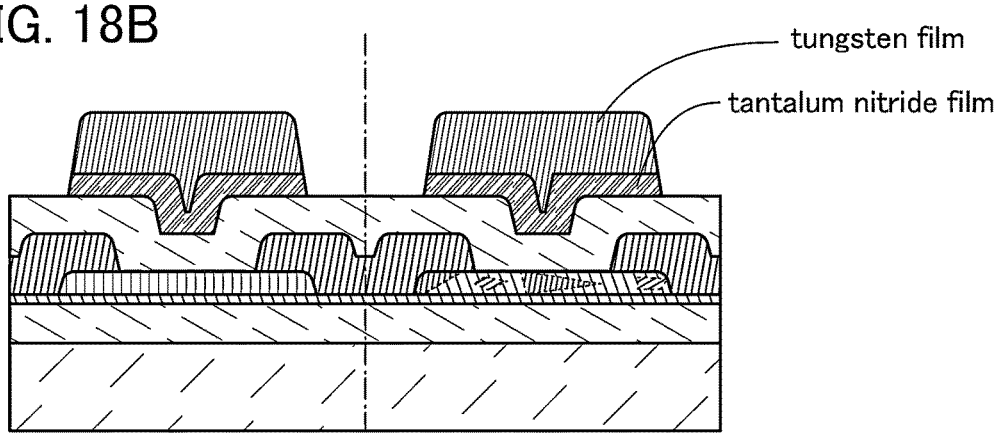
Figure 18C:
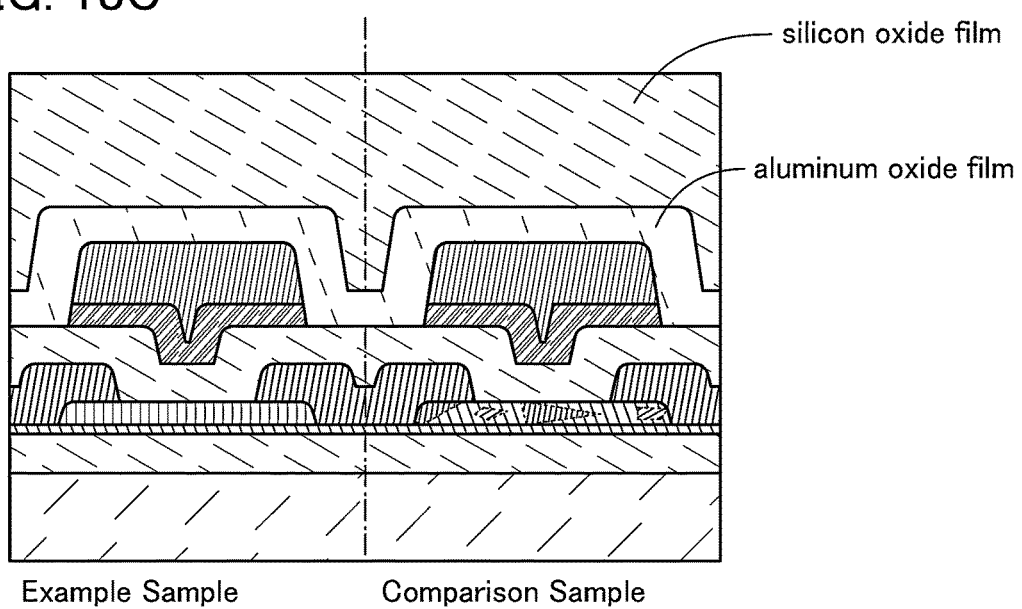

Next, as a gate electrode, a 35-nm-thick tantalum nitride film and a 135-nm-thick tungsten film were formed in this order (see FIG. 18B).

Next, as a protective insulating film, a 50-nm-thick aluminum oxide film and a 300-nm-thick silicon oxide film were formed in this order. Through the above steps, Example Sample and Comparison Sample were fabricated (see FIG. 18C).

Figure 19:
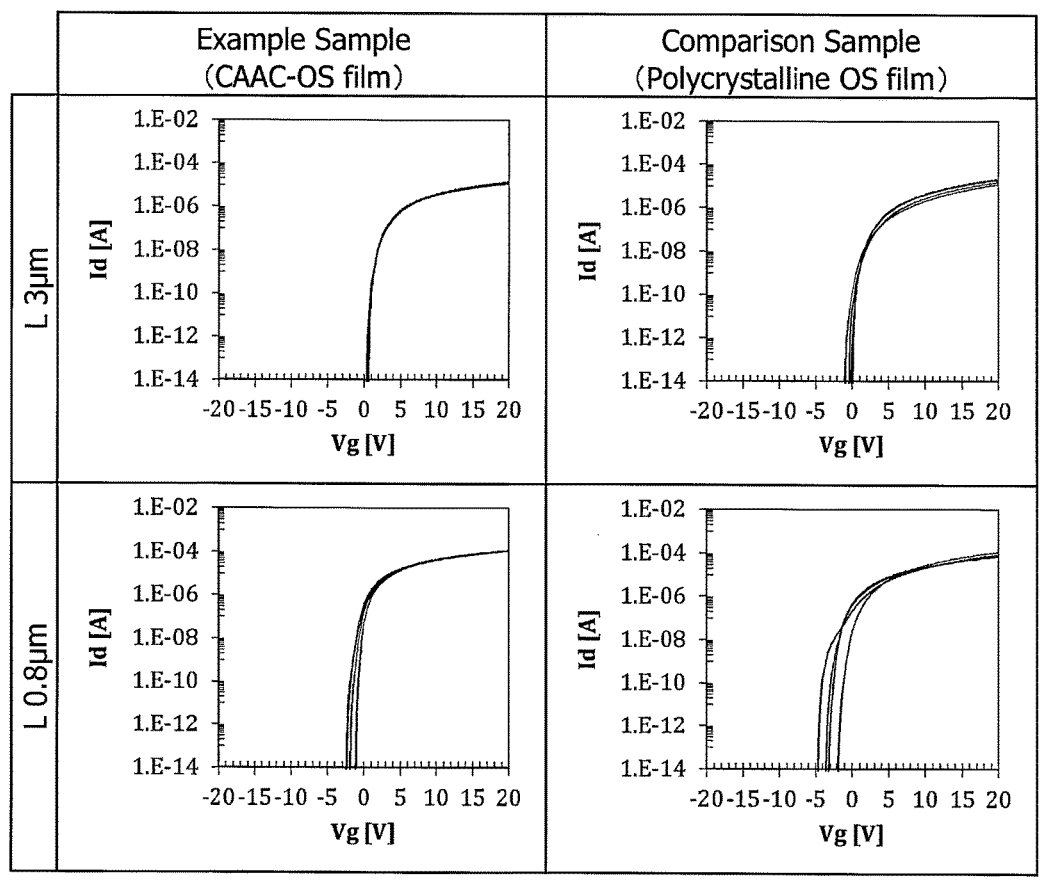
FIG. 19 shows $V_g$-$I_d$ characteristics of samples.

Using Example Sample and Comparison Sample which were fabricated through the above steps, electrical characteristics ($V_g$-$I_d$ characteristics) of transistors with two sizes were measured (see FIG. 19). The measurement of the $V_g$-$I_d$ characteristics was performed by measuring drain current ($I_d$) when the drain voltage was set to 0.1 V or 3 V and the gate voltage ($V_g$) was swept in the range from −20 V to +20 V in increments of 0.25 V. Note that a first transistor had a channel length (L) of 3 μm and a channel width (W) of 10 μm, and a second transistor had a channel length (L) of 0.8 μm and a channel width (W) of 10 μm.

Figure 20:
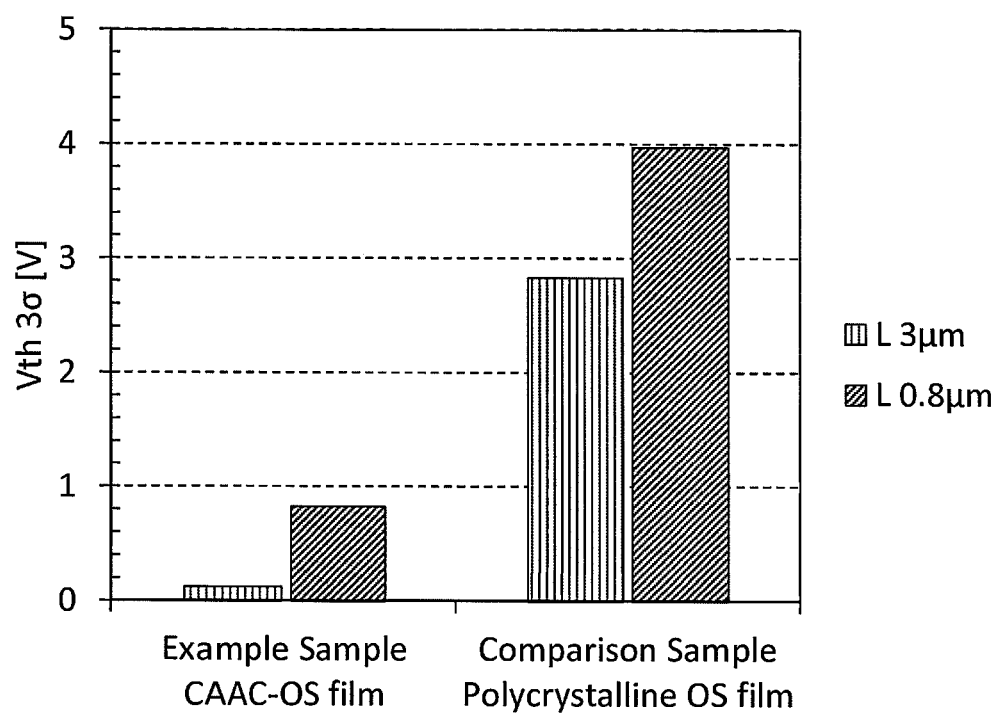
FIG. 20 shows variation in threshold voltage of samples.

From FIG. 19, it was found that Example Sample using the CAAC-OS film had less variation in $V_g$-$I_d$ characteristics than Comparison Sample using the polycrystalline OS film. Variations in threshold voltage (3σ) in the $V_g$-$I_d$ characteristics of Example Sample and Comparison Sample were as follows: 0.13 V for the first transistor (L: 3 μm) of Example Sample and 2.83 V for that of Comparison Sample. Further, the second transistor (L: 0.8 μm) of Example Sample was 0.83 V and that of Comparison Sample was 3.98 V (see FIG. 20).

Variation in $V_g$-$I_d$ characteristics of the transistors of Example Sample and Comparison Sample is considered to depend on whether a grain boundary exists in the OS film (which of the CAAC-OS film and the polycrystalline OS film is used).

According to Example, when a CAAC-OS film is used as a semiconductor film of a transistor, the transistor can have less variation in electrical characteristics.

EXPLANATION OF REFERENCE

100: pellet, 100a: pellet, 100b: pellet, 103: CAAC-OS film, 103a: CAAC-OS film, 103b: CAAC-OS film, 120: ion, 130: region, 150: substrate, 150a: substrate, 150b: substrate, 160: backing plate, 170a: magnet, 170b: magnet, 170c: magnet, 180: target, 185: cleavage plane, 190: magnetic force line, 700: deposition apparatus, 701: atmosphere-side substrate supply chamber, 702: atmosphere-side substrate transfer chamber, 703a: load lock chamber, 703b: unload lock chamber, 704: transfer chamber, 705: substrate heating chamber, 706a: deposition chamber, 706b: deposition chamber, 706c: deposition chamber, 751: cryotrap, 752: stage, 761: cassette port, 762: alignment port, 763: transfer robot, 764: gate valve, 765: heating stage, 766: target, 767: attachment protection plate, 768: substrate stage, 769: substrate, 770: vacuum pump, 771: cryopump, 772: turbo molecular pump, 780: mass flow controller, 781: refiner, and 782: gas heating system.

This application is based on Japanese Patent Application serial no. 2013-106735 filed with Japan Patent Office on May 21, 2013, the entire contents of which are hereby incorporated by reference.

The invention claimed is:

1. An oxide semiconductor film over a substrate, comprising a plurality of flat-plate-like crystalline In—Ga—Zn oxides,
wherein flat planes of the plurality of flat-plate-like crystalline In—Ga—Zn oxides face an upper surface of the substrate,
wherein a grain boundary between the plurality of flat-plate-like crystalline In—Ga—Zn oxides is not observed with a transmission electron microscope,
wherein metal atoms of the flat-plate-like crystalline In—Ga—Zn oxides are shown to be arranged in a hexagonal configuration in an image,
wherein the oxide semiconductor film has a continuous structure in which different crystal regions are connected while maintaining c-axis alignment, and
wherein a gap among the plurality of flat-plate-like crystalline In—Ga—Zn oxides is filled with zinc oxide.

2. The oxide semiconductor film according to claim 1, wherein the plurality of flat-plate-like crystalline In—Ga—Zn oxides are stacked.

3. The oxide semiconductor film according to claim 1, wherein an equivalent circle diameter of the flat plane of one of the flat-plate-like crystalline In—Ga—Zn oxides is greater than or equal to 1 nm and less than or equal to 3 nm.

4. The oxide semiconductor film according to claim 1, wherein a thickness of one of the flat-plate-like crystalline In—Ga—Zn oxides is greater than or equal to 0.5 nm and less than or equal to 0.9 nm.

5. The oxide semiconductor film according to claim 1, wherein the zinc oxide has an amorphous structure.

6. The oxide semiconductor film according to claim 1, wherein the image is obtained by image processing where a high resolution plane-view TEM image is transferred by a Fourier transform, filtered, and transferred by an inverse Fourier transform.

7. An oxide semiconductor film over a substrate, comprising a plurality of flat-plate-like crystalline In—Ga—Zn oxides,
wherein flat planes of the plurality of flat-plate-like crystalline In—Ga—Zn oxides face an upper surface of the substrate,
wherein a grain boundary between the plurality of flat-plate-like crystalline In—Ga—Zn oxides is not observed with a transmission electron microscope,
wherein metal atoms of the flat-plate-like crystalline In—Ga—Zn oxides are shown to be arranged in a hexagonal configuration in an image, wherein end portions of the plurality of flat-plate-like crystalline In—Ga—Zn oxides are terminated with oxygen, wherein the oxygen is negatively charged, and wherein a gap among the plurality of flat-plate-like crystalline In—Ga—Zn oxides is filled with zinc oxide.

8. The oxide semiconductor film according to claim 7, wherein the plurality of flat-plate-like crystalline In—Ga—Zn oxides are stacked.

9. The oxide semiconductor film according to claim 7, wherein an equivalent circle diameter of the flat plane of one of the flat-plate-like crystalline In—Ga—Zn oxides is greater than or equal to 1 nm and less than or equal to 3 nm.

10. The oxide semiconductor film according to claim 7, wherein a thickness of one of the flat-plate-like crystalline In—Ga—Zn oxides is greater than or equal to 0.5 nm and less than or equal to 0.9 nm.

11. The oxide semiconductor film according to claim 7, wherein the zinc oxide has an amorphous structure.

12. The oxide semiconductor film according to claim 7, wherein the image is obtained by image processing where a high resolution plane-view TEM image is transferred by a Fourier transform, filtered, and transferred by an inverse Fourier transform.

* * * * *